US009093280B2

(12) United States Patent
Sato et al.

(10) Patent No.: US 9,093,280 B2
(45) Date of Patent: Jul. 28, 2015

(54) SEMICONDUCTOR DEVICE AND MANUFACTURING METHOD OF SEMICONDUCTOR DEVICE

(75) Inventors: Yuichi Sato, Mie-ken (JP); Satoshi Nagashima, Mie-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 302 days.

(21) Appl. No.: 13/607,308

(22) Filed: Sep. 7, 2012

(65) Prior Publication Data

US 2013/0241072 A1 Sep. 19, 2013

(30) Foreign Application Priority Data

Mar. 19, 2012 (JP) ................ P2012-061972

(51) Int. Cl.
H01L 27/10 (2006.01)
H01L 23/52 (2006.01)
H01L 23/48 (2006.01)
H01L 21/033 (2006.01)
H01L 27/115 (2006.01)

(52) U.S. Cl.
CPC ........ H01L 21/0337 (2013.01); H01L 21/0338 (2013.01); H01L 27/11519 (2013.01); H01L 27/11524 (2013.01)

(58) Field of Classification Search
CPC ............ H01L 21/0337; H01L 21/0338; H01L 27/11519; H01L 27/11524
USPC ..................... 257/208, 776, E23.01
See application file for complete search history.

(56) References Cited

U.S. PATENT DOCUMENTS

| 6,495,870 | B1* | 12/2002 | Sekiguchi et al. ............ 257/208 |
| 7,084,440 | B2* | 8/2006 | Sel et al. ..................... 257/208 |
| 8,399,347 | B2* | 3/2013 | Lindsay ....................... 438/612 |
| 2008/0017996 | A1* | 1/2008 | Sato et al. ..................... 257/784 |
| 2009/0221147 | A1 | 9/2009 | Kikutani et al. |
| 2010/0038795 | A1 | 2/2010 | Aburada et al. |
| 2011/0117745 | A1* | 5/2011 | Sato et al. ..................... 438/703 |

FOREIGN PATENT DOCUMENTS

| JP | 2009-302143 | 12/2009 |
| JP | 2011-119536 | 6/2011 |

* cited by examiner

*Primary Examiner* — Luan C Thai
(74) *Attorney, Agent, or Firm* — Patterson & Sheridan, LLP

(57) ABSTRACT

A semiconductor device has 3n, 3n+1, and 3n+2 connector lines that are formed together. The 3n+1 connector line is located between the 3n connector line and the 3n+2 connector line. The first fringe pattern pad is located at the terminus of the 3n connector line and is formed with a wider space than the width of the 3n connector line. The second fringe pattern pad is located at the terminus of the 3n+1 connector line and is formed with a wider width than the width of the 3n+1 connector line. The third fringe pattern pad is located at the terminus of the 3n+2 connector line and is formed with a wider width than the width of the 3n+2 connector line. The second fringe pattern pad is positioned closer to a memory array as compared with the terminus of each connector line with the first and third fringe pattern pads.

17 Claims, 88 Drawing Sheets

MC: MEMORY CELL
1: NAND TYPE FLASH MEMORY DEVICE
WL: WORD LINE, CONNECTOR LINE

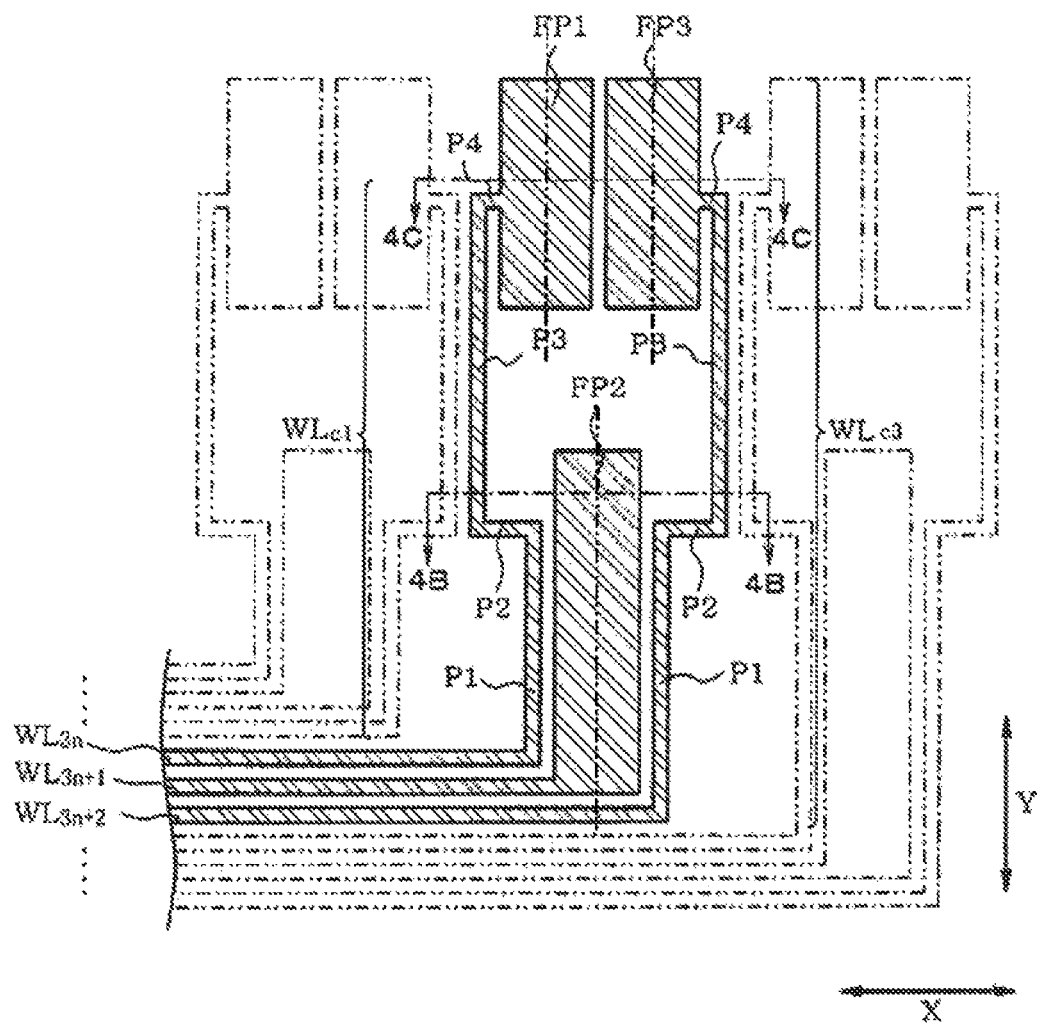

SEMICONDUCTOR DEVICE AND MANUFACTURING METHOD OF SEMICONDUCTOR DEVICE

CROSS-REFERENCE TO RELATED APPLICATION

This application is based upon and claims the benefit of priority from Japanese Patent Application No. 2012-061972, filed Mar. 19, 2012; the entire contents of which are incorporated herein by reference.

FIELD

Embodiments described herein relate to a semiconductor device and a manufacturing method of the semiconductor device.

BACKGROUND

It is known that the floating gate type of stacked gate electrodes that are stacked with floating electrodes (FG) and control electrodes (CG) are used in memory cells integrated into NAND flash memory devices.

Recently, along with development of miniaturizing, or further high scale integration of semiconductor elements, memory cells have been manufactured by a design rule that exceeds the limits of normal lithography technology. One methodology to further reduce dimensions, below that achievable by optical lithography and patterning alone is what is known as the side-wall transferring process which can form fine connector lines that exceed the optical limit photolithography.

Conventionally, where the linewidth and device size shrink demands approach the limits of optical lithography methods, the double patterning method is used for patterning the features, including the fine lines and spaces. However, with further advancements in miniaturization requirements, the adoption of triple patterning is under consideration, as the optical and physical limits of even the double patterning method are being reached.

Furthermore, as the density of the memory cells in a memory device are increased, the need to connect the memory cells, using traditional connector line fringe pattern pads provided around the cells, is also reaching the limits of miniaturization, because the number of fringe pattern pad pads must increase at the same rate as the number of lines (e.g., word line, bit line, etc.) of memory cells is increased, yet their size is not subject to the same design rules and are typically of a substantially larger size that the memory cells. The fringe pattern pad is patterned in a wide space, in order to interconnect the fringe pattern pad pads to memory cells or memory cell blocks through the word, bit and selector gate lines and enable the connection of the pads to additional electrical connections exterior to the high density memory cell matrix. As described above, with the advancement of miniaturization, the spacing between the adjacent interconnect connector lines extending from the memory cells to these pads at the fringe becomes extremely narrow, and it is impossible to secure the space for the formation of a wide fringe pattern pad to accommodate connection to these interconnects in the fringe region of the device.

DESCRIPTION OF THE DRAWINGS

FIG. 3 is a plan view showing a part of the configuration near the end of the word line in the first embodiment schematically.

DETAILED DESCRIPTION

Figure 1:
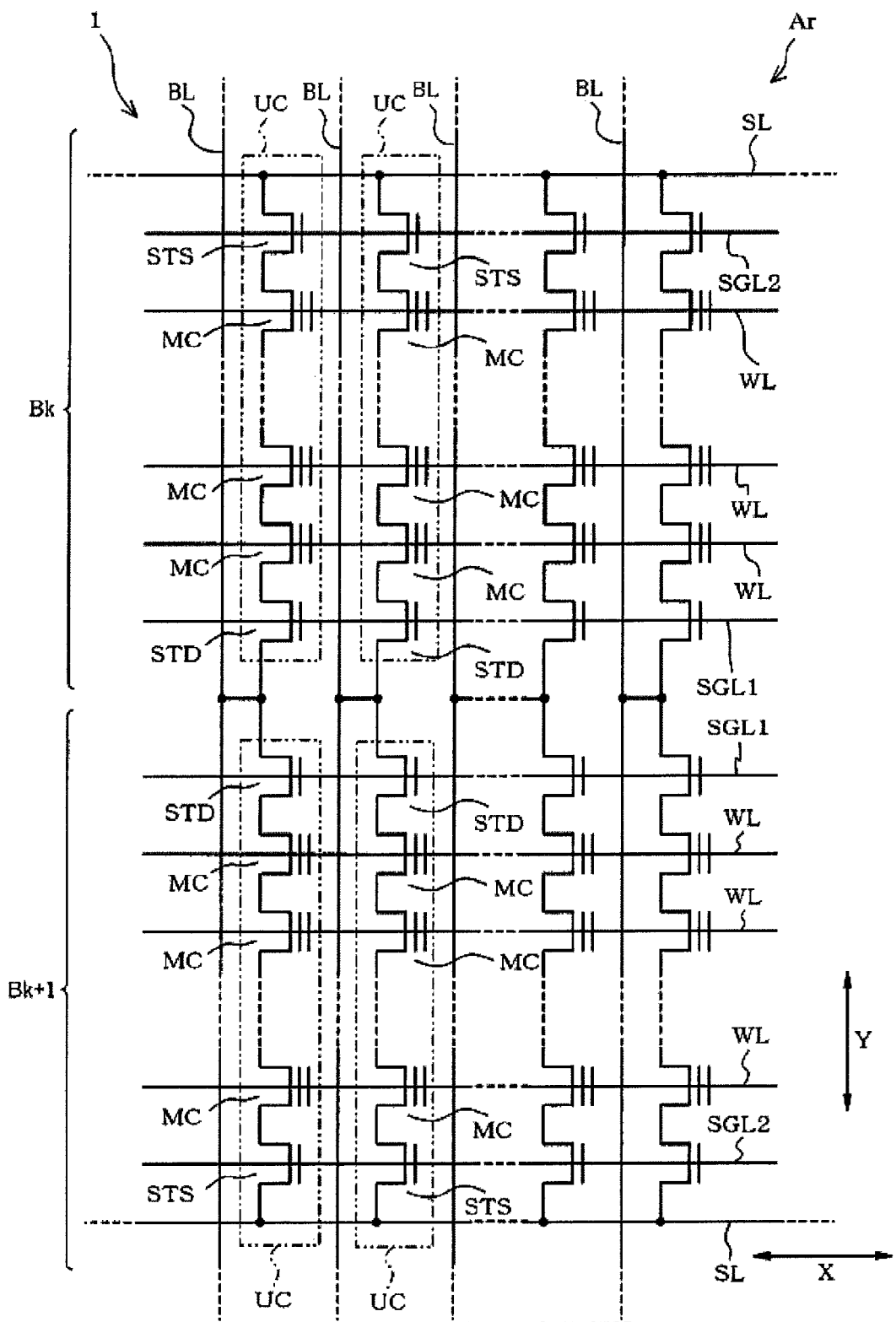
FIG. 1 is a block diagram showing an electrical configuration of the first embodiment.

According to the embodiments herein, there is provided a semiconductor device and fabrication method thereof that is possible to secure the formation region of a wide fringe pattern pad even if the spacing between the adjacent connector lines interconnecting the fringe pattern pad to the memory cell array is narrow.

The semiconductor device related to the embodiment includes a 3n+1 connector line stretched between the 3n connector line and 3n+2 connector line, the connector lines 3n, 3n+1, 3n+2 are grouped together into one group, and the lines are provided with repetition of m times (m is an integer of 2 or more). In this embodiment, the 3n+1 connector line is described with relation to connecting the word lines of the memory cell array to the fringe pattern, but the description is equally applicable to the connection of the bit and signal lines to the fringe pattern.

The first fringe pattern pad is positioned at the terminus of the 3n connector line (n is an integer of 1-m) and has a width wider than that of the 3n connector line. The second fringe pattern pad is positioned at the terminus of the 3n+1 connector line and has a width wider than that of the 3n+1 connector line; and a third fringe pattern pad is positioned at the terminus of the 3n+2 connector line and has a width wider than that of the 3n+2 connector line. In this embodiment, each of the 3n, 3n+1 and 3n+2 connector lines interconnect a fringe pattern pad to a respective word line in the memory cell array of a memory device. To enable multiple fringe pattern pads in the lateral, i.e., length or width dimension of the memory cell array, the pad locations are staggered, and in this embodiment, the second fringe pattern pad is arranged inwardly of, i.e., closer to the cell array than are the first and second fringe pattern pads. In this way, by staggering the placement of the pads into more than one row, the number of pads that may be located along the periphery of a memory cell array is effectively increased, while the miniaturization required positioning the multiple connectors 3n . . . is realized.

In general, according to one embodiment, the process of fabrication of the semiconductor device includes a process that forms the stacked structural layer of the gate electrode of the memory cell. Moreover, it forms the core pattern for the connector line formation of 3n+1 on the stacked structural layer and a process that forms a fringe mask pattern at the edge of the core pattern. Also, it includes a process that forms spacers along the sidewall of the core pattern and the fringe mask pattern. Moreover, it includes a process that forms the first mask pattern by which a part of the fringe mask pattern and a part of the spacer are covered. Furthermore, along the sidewall of the first mask pattern, it is spaced outside of the core pattern along the sidewall of the spacer. It includes a process that forms the outside sideward pattern for the 3n and the 3n+2 connector line formation to the same design rule/feature sizes as used for the word line.

Moreover, it includes a process that forms a second mask pattern with which the portion of the region adjacent to where the connector line for the outermost fringe pattern pads will be formed is covered. Furthermore, it includes a process of anisotropic etching of the stacked structural layer of the gate electrode of the memory cell used as a mask of the core pattern, the fringe pattern, and the second mask pattern. Additionally, it includes a process of removing a portion of a loop shaped stack in the fringe region.

The process of fabrication of the semiconductor device according to the embodiment includes a step that forms a stacked structural layer of the gate electrode of the memory cell. Moreover, it includes a step that forms the core pattern for the formation of the 3n+1 connector line on the stacked structural layer, and the fringe mask pattern at the edge of the core pattern. Moreover, it includes a process that forms a spacer along the sidewalls of the core pattern and the fringe mask pattern.

Moreover, it includes a process that forms the outside sideward pattern for the formation of 3n and 3n+2 connector line into a loop shape, by dividing it to the outside of the core pattern along the sidewall of the spacer. Moreover, it includes a process that removes a part of the fringe mask pattern in the distance from the gate electrode of the memory cell. Moreover, it includes a process that forms the third mask pattern with which the fringe region of the outside of the fringe pattern is covered. Moreover, it includes a process of anisotropic etching of the stacked structural layer of the memory cell gate electrode as a mask of the core pattern, the outside sideward pattern, and the third mask pattern. Moreover, it includes a process of cutting the loop shaped stacked layer in the fringe area.

Embodiment 1

The first embodiment, applied to the NAND type of a flash memory device, is described with reference to FIG. 1 to FIG. 25C. The identical or similar numbers relate to the identical or similar parts in the description within the reference drawings below. Moreover, in the description of the embodiment, the directions including top and down, left and right, high and low, and the depth of the trench are in reference to the relative position based on the back side of the semiconductor substrate described below.

As shown in FIG. 1, the NAND type flash memory device 1 includes a memory cell array Ar that contains a great number of memory cells (memory cell transistor) MC in a matrix state. The memory cell array Ar includes a multiplicity of blocks Bk, Bk+1 . . . .

Figure 2:
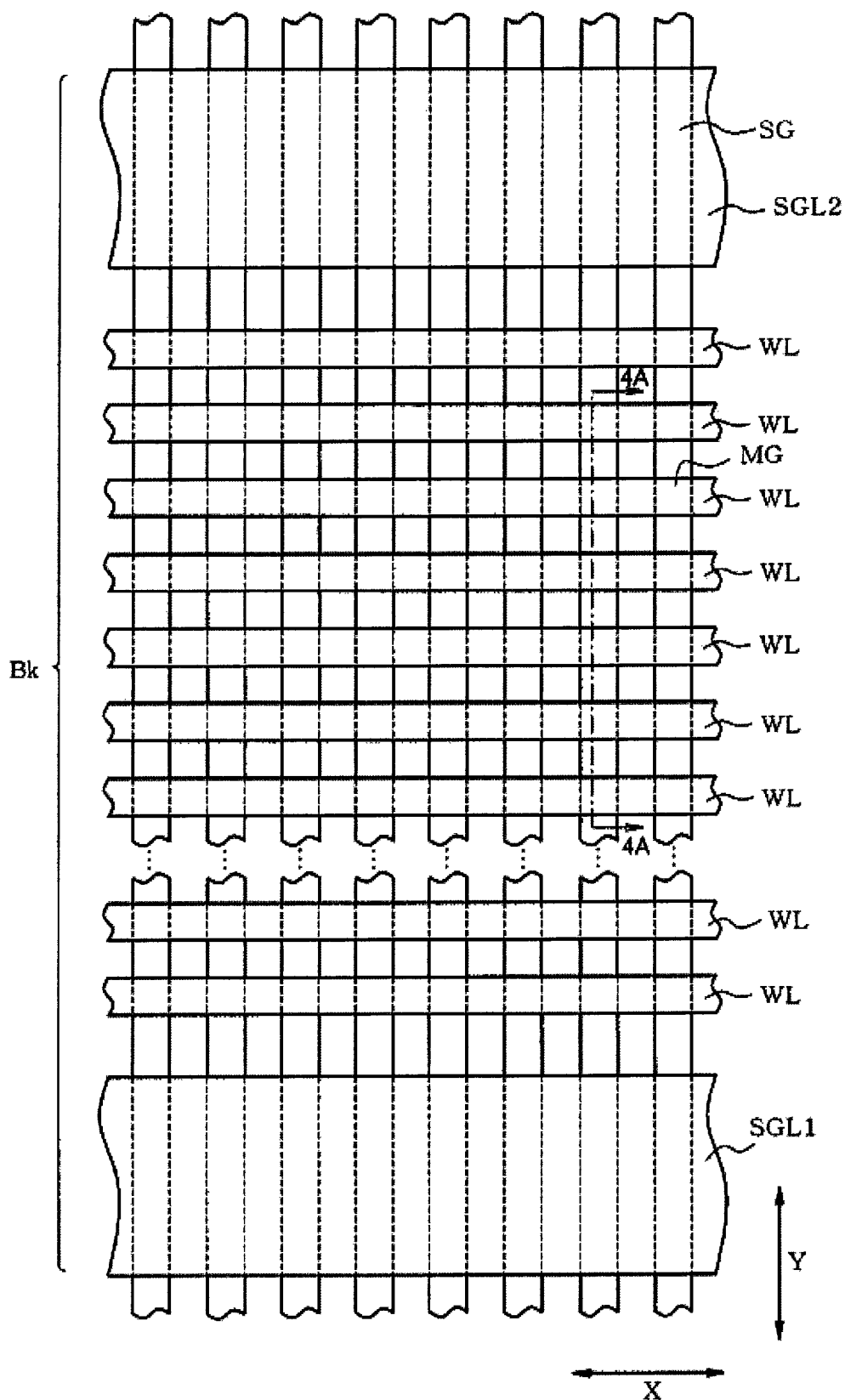
FIG. 2 is a plan view showing a part of the configuration of the memory cell array in the first embodiment schematically.

FIG. 1 shows the number k of the block Bk and the number (k+1) of the block Bk+1. FIG. 2 shows a plan view of one of the blocks Bk. The block Bk is provided in the column-wise direction (Y direction). Each block Bk includes a number of NAND cell units UC (within dashed lines in FIG. 1) one after the other in the row-wise direction (X direction).

Each of the NAND cell units UC are provided with selector gate transistors STD on the drain side and selector gate transistors STS on the source side. The bit line BL is connected with one of the drain or source on the selector gate transistor STD. Moreover, the source line SL is connected with one of the drain or source on the selector gate transistor STS.

NAND cell unit UC includes a number of memory cells MC between the selector gate transistors STD-STS. These memory cells MC share the drain/source region and are serially connected in the column-wise direction (Y direction). It is also acceptable to provide a dummy transistor between the selector gate transistor STD and its side memory cell MC. That is, a dummy transistor may be provided between the selector gate transistor STS and its side memory cell MC.

A multiplicity of bit lines BL are spaced apart and extend column-wise (Y direction). One of the bit lines BL is formed to correspond to a plurality of NAND cell units UC spaced along the column-wise wise direction. The source line SL extends between across the adjacent blocks of unit cells in the row-wise direction (X direction).

The selector gate line SGL1 is a connector line interconnecting the selector gate electrode of the selector gate transistor STD. Selector gate line SGL2 is an interconnecting connector line for the selector gate electrode of selector gate transistor STS. The word line WL becomes the connector line that interconnects the control electrodes CG of the memory cell MC of each of a plurality of cell units UC aligned in the row-wise direction (see FIG. 4A).

FIG. 3 shows the plan view in the vicinity of the edge of word line WL schematically. Since voltage is applied from the peripheral circuit (not shown) to the control gate electrode of memory cell MC, the fringe pattern pads FP1-FP3 are provided at the edge of word line WL for conduction of electricity into along the word line WL.

These fringe pattern pads FP1-FP3 are flatly formed, having a pattern that is wider than the line width of the word line WL. In this specific embodiment, the word lines WL are extended from the memory cell array in groups of three lines as shown in FIG. 3. The pattern repeats for each memory cell unit MC, and for the cell array, in that the word lines extend to the periphery of the cell array in groups of three lines, relatively evenly spaced along the edge area of the cell array. Three fringe pattern pads FP1-FP3 form are formed adjacent one another, as a group, and one of each of the three pads FP1-FP3 are in electrical contact with one of the word lines $WL_{3n}$-$WL_{3n+2}$. These fringe pattern pads FP1-FP3 are likewise repeatedly formed at regular intervals along the periphery of the unit cell arrays making up the memory cell. Therefore, the reference code "FP1" is assigned to the fringe pattern pad for the 3n word line $WL_{3n}$, the reference code "FP2" is assigned to the fringe pattern pad for the 3n+1 word line $WL_{3n+1}$, and the reference code "FP3" is assigned to the fringe pattern pad for 3n+2 word line $WL_{3n+2}$ in the description. The letter n is an integer of 0 or above.

As shown in FIG. 3, the fringe pattern pads FP1-FP3 are planar rectangular shapes (rectangle or square) with flat sides in the directions of X and Y, and they are configured to have a shortened width in the X direction than their length in the Y direction. As shown in FIG. 3, the fringe pattern pads FP1 and FP3 are located along the same axis in the X direction, and they are paced in the Y direction from the fringe pattern pad FP2.

The 3n word line $WL_{3n}$ is configured to include a bend therein, from which the line extends in the Y direction toward the first pad FP1 generally parallel to the side of the second pad FP2, and an offset portion positioned between the bend and the pad FP1. The 3n+2 word line $WL_{3n+2}$ is likewise configured, but in the mirror image of the word line $WL_{3n}$. The 3n+1 word line $WL_{3n+1}$ is shortened, as it does not include a bend, and extends directly into the adjacent side of the pad FP2 adjacent a corner thereof.

As shown in FIG. 3, the bend and offset part $WL_{c1}$ is a pattern provided to ensure physical and electrical separation of the fringe pattern pad FP1 from the fringe pattern pad FP2 in the Y direction and enable connection of the connecting line to the side of the pad FP1. Similarly, the bend and offset part $WL_{c3}$ is a pattern provided to ensure physical and electrical separation of the fringe pattern pad FP3 from the fringe pattern pad FP2 in the Y direction and enable connecting of the connecting line to the side of pad FP3.

The bend and offset parts $WL_{c1}$ and $WL_{c3}$ include linear connector lines P1 to P4, respectively, and these connector lines P1 to P4 are interconnected nearly at a right angle.

The sides of the respective fringe pattern pads FP2 of the connector line P1 for the bend and offset part $WL_{c1}$ and $WL_{c3}$ extend along the Y direction. The connector lines P2 for the bend and offset parts $WL_{c1}$ and $WL_{c3}$ are interconnected with the termini of the corresponding connector line P1. These junctions are located to either side, in the X direction, of the pad FPs, intermediate the ends thereof in the Y direction, and the connector line P2 extends therefrom in the in the X.

The connector line P3 is interconnected with the terminus of the connector line P2 furthest from the fringe pattern pad FP2, and extends therefrom in the Y direction in the direction of the pads FP1 and FP3.

The connector line P4 of the bend and offset part $WL_{c1}$ are interconnected with the terminus of the connector line P3 located farthest from the fringe pattern pad FP2, and are connected with the fringe pattern pad FP1 from along the span of the fringe pattern pad FP1 in the Y direction. In particular, the connector line P4 of the bend and offset part $WL_{c1}$ is interconnected with the middle portion at the side of the rectangular fringe pattern pad FP1 in the Y direction.

The connector line P4 of the bend and offset part $WL_{c3}$ is likewise configured, and is interconnected with the terminus of the connector line P3 located at the farthest distance from the fringe pattern pad FP2, and interconnected with the fringe pattern pad FP3 along the span thereof in the Y direction. In particular, the connector line P4 of the bend and offset part $WL_{c3}$ interconnects with the middle portion at the sides of the rectangular fringe pattern pad FP3 in the Y direction. As shown in FIG. 3, these fringe pattern pads FP1-FP3 and the bend and offset areas $WL_{c1}$ and $WL_{c3}$ form a repeating pattern in the X direction.

Each of the fringe pattern pads FP1, FP3 have an equal length, and an equal, shorter, width, and are disposed in a line such that a linear axis passing through the lengthwise center of the pads would have an equal pad area to either side thereof. In contrast, the pads FP2 in adjacent groups of 3 pads, i.e., the pad FP2 shown in phantom to the left and the right of pad FP2 in the center of FIG. 3 all have different lengths, but a common width, and the pattern of three different lengths repeats after every three sets of fringe pattern pads.

Figure 4A:
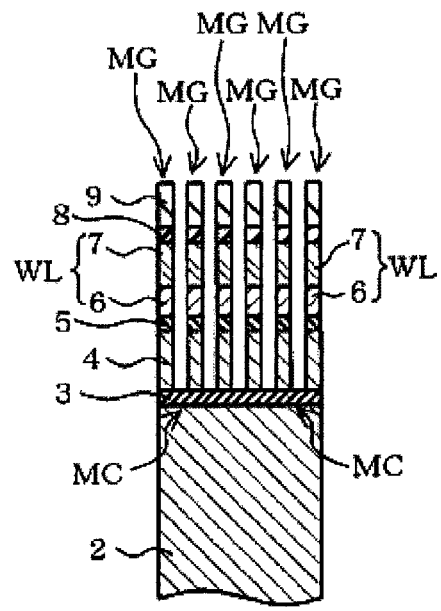
FIGS. 4A to 4C show the longitudinal side views A-C showing the structure of an essential part of the first embodiment and are the longitudinal side views shown along the line 4A-4A in FIG. 2, the line 4B-4B in FIG. 3, and the line 4C-4C in FIG. 3, respectively.
Figure 4B:
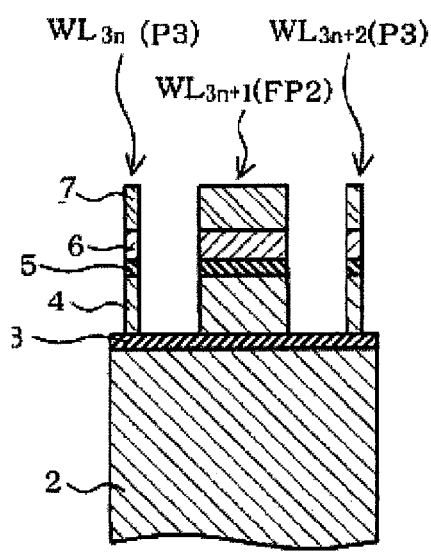

FIG. 4A shows a longitudinal schematic section of a memory cell MC; FIG. 4B shows the sectional view of the of the connector lines P3 and pad FP2 at section 4B-4B of FIG. 3, and FIG. 4C shows the sectional view of the fringe pattern pads FP1 and FP3 at section 4C-4C of FIG. 3.

As shown in FIG. 4A, the memory cell MC is formed, in part, by a plurality of individual stacks of thin foil layers. These layers include a plurality of memory cell gate electrodes MG which are formed having a floating electrode (the charge storage layer) 4 and an a inter-electrode insulation film (intermediate insulating film) 5. The control electrode CG includes a silicon layer 6 which is formed on the inter-electrode insulation film 5, as well as a silicide layer 7 which is formed on the silicon layer 6. The stack is then capped by a silicon nitride film 8 and TEOS dielectric or insulator film 9 formed over the semiconductor substrate 2 to form a cap film.

Figure 4C:
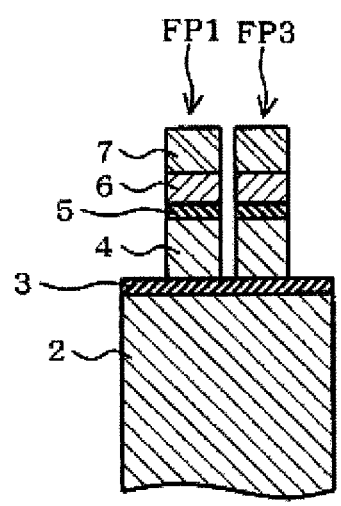

As shown in FIGS. 4B and 4C, the fringe pattern pads FP1-FP3 which interconnect to the terminus of the word lines $WL_n$-$WL_{n+2}$, have a stacked structure which is nearly identical to the word lines $WL_n$-$WL_{n+2}$, except the cap layer is not present, and the width of the film layer materials may be significantly widened. Thus, the film layer forming the pads FP1-FP3 of the fringe pattern are continuations of those used to form the memory cells.

Figure 5A:
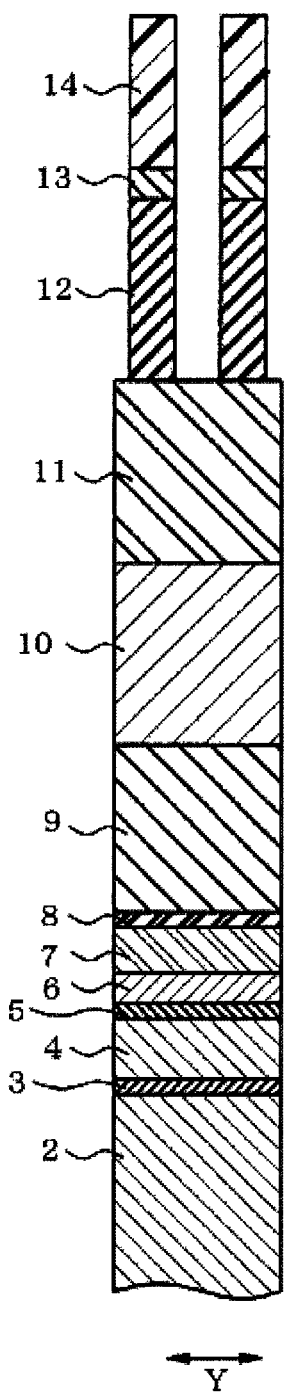
FIGS. 5A to 5C show the longitudinal side views show a stage of the fabrication process in the first embodiment (A-C are the longitudinal side views shown, along the 4A-4A line in FIG. 2, line 4B-4B in FIG. 3, and 4C-4C in FIG. 3).

The fabrication steps, and methods of performing those steps, for forming the memory cell and finger pattern structure include a plurality of deposition, patterning, and etching steps, including the use of side wall transferring technology to enable spacing and critical dimensions below that available using traditional photolithographic techniques. In the following reference drawings, the figure marked with A corresponds with the sectioned structure corresponding to FIG. 4A, and the figure marked with B corresponds with the sectioned structure corresponding to FIG. 4B, and the figure marked with C corresponds to the sectioned structure corresponding to FIG. 4C. For example, the sectional view of FIG. 5A represents a precursor to the structure ultimately formed in FIG. 4A. In the figures, a portion of the device, such as the underside of the wafer, is omitted in the figure. Moreover, the following description of the fabrication process is focused on the characteristic processes of this embodiment, other ordinary processes may be inserted between each of the process, or a part of the following process may be deleted from the process if it is not necessary. Moreover, each process may be replaced if it is practically possible according to the requirement.

Figure 5B:
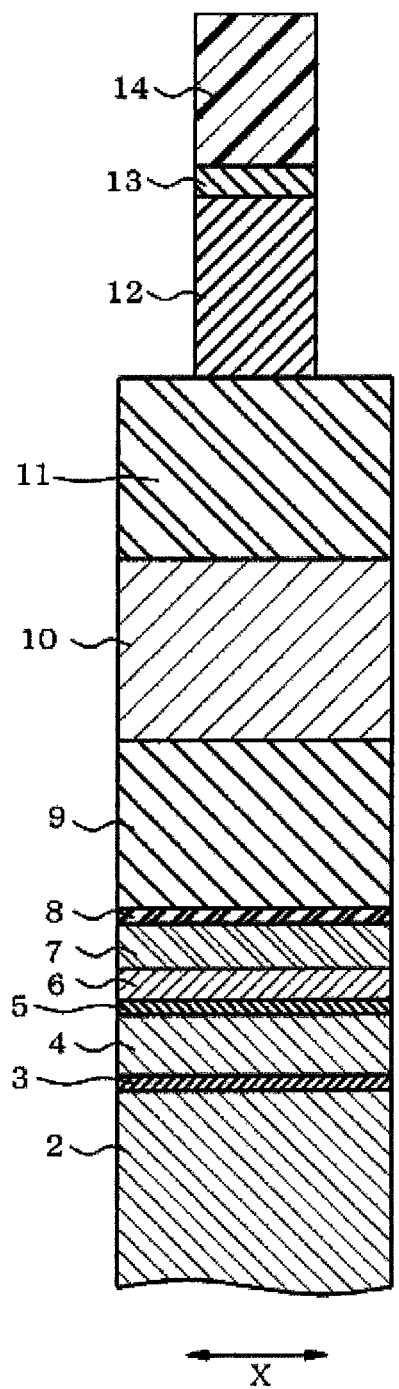
Figure 5C:
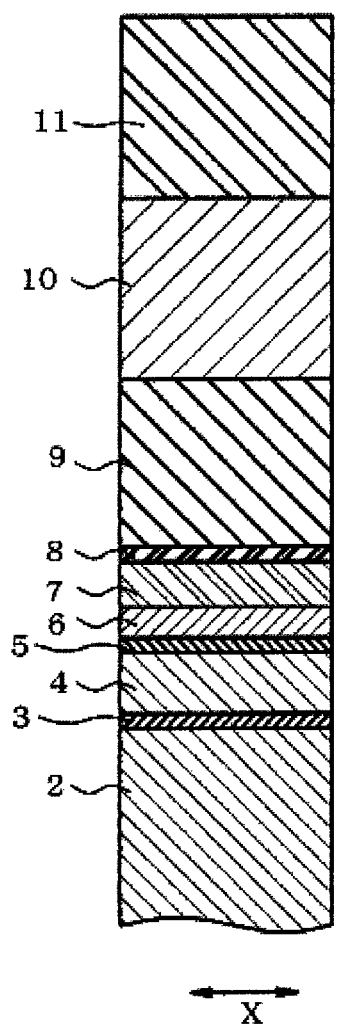

As shown in FIG. 5A to FIG. 5C, a plurality of film layers 3 to 14 are formed on a semiconductor substrate 2, and thus the stack of layers 4 to 9 which make up the structure of the gate electrode MG of the memory cell MC are formed. In this FIG. 5A to FIG. 5C, 3 is a gate insulator, 4 is a floating electrode, 5 is an inter-electrode insulation film, 6 is a silicon layer, 7 is a silicide layer, 8 is a silicon nitride film that forms a cap film, 9 is a dTEOS film, 10 is a silicon layer, 11 is a silicon nitride film, 12 is a hard mask, 13 is an antireflection coating, and 14 is a resist pattern. The floating electrode 4 and silicon layers 6 and 10 are formed by the deposition of amorphous silicon. Immediately after deposition, the silicon is amorphous, and after heat-treatment, it transforms into a polysilicon state.

The details for the formation of the structure of FIG. 5A to FIG. 5C may use the following fabrication process as an example. A single crystal semiconductor substrate 2 is selected on which to form the devices described herein. A gate insulator 3 film is formed on the semiconductor substrate 2, for example, using the thermal oxidation method. Next, an impurity doped amorphous silicon film is deposited on the gate insulator 3 to form the layer from which the floating electrodes 4 will be formed employing the CVD (Chemical Vapor Deposition) method. Next, the inter-electrode insulation film 5 is formed over the floating electrode material 4 using a LP CVD method.

A doped amorphous silicon layer 6 is then deposited on the interelectrode insulation film 5 by the CVD method. A metal such as tungsten (W) is then deposited on the silicon layer 6 by sputtering. A silicide layer 7 is formed by heat-treatment of the metal on the silicon layer 6, to form for example a tungsten silicide film.

A silicon nitride film 8 is then deposited as a cap film by the CVD method, and a TEOS film 9 (silicon oxide using TEOS as a source gas) is deposited for later use as a hard mask using a plasma CVD method. Next, a doped silicon layer 10 is deposited by the CVD method over the silicon oxide layer 9. A silicon nitride film 11 is then deposited on the silicon layer 10 by the CVD method Next, a hard mask 12 is deposited on the silicon nitride film 11 by the CVD method. A resist is then coated on the hard mask 12 via an antireflection coating 13. After exposing and developing the resist, the resist pattern 14 is formed. A hard mask 12 is anisotropically etched by the RIE method as a mask of the resist pattern 14. Thus, it is acceptable to form the structure in FIG. 5A to FIG. 5C by etching trenches in the film stack to form individual pillars of the films 3 to 11 and etch the layers 12 to 14 as shown in FIGS. 5A and 5B.

The minimum width of the resist pattern 14 in this fabrication step is the width that allows patterning by using the common lithography technology. Compared with the cross section in FIG. 5A and FIG. 5B, the width of the pattern in the Y direction shown in FIG. 5A is narrower than the width of the pattern in the X direction in FIG. 5B. The width of the pattern in the Y direction of FIG. 5A will be the width of the size corresponding to the width of the word line WL, and the pattern width in the Y direction in the formation stage may be wider than the final target width of the word line WL.

Moreover, the width of the pattern in the X direction shown in FIG. 5B will be a width that is wider than the final target width of the fringe pattern pad FP2 corresponding to the fringe pattern pad FP2. The stacked structures 12 to 14 are not present in cross section shown in FIG. 5C in this fabrication step.

Figure 6A:
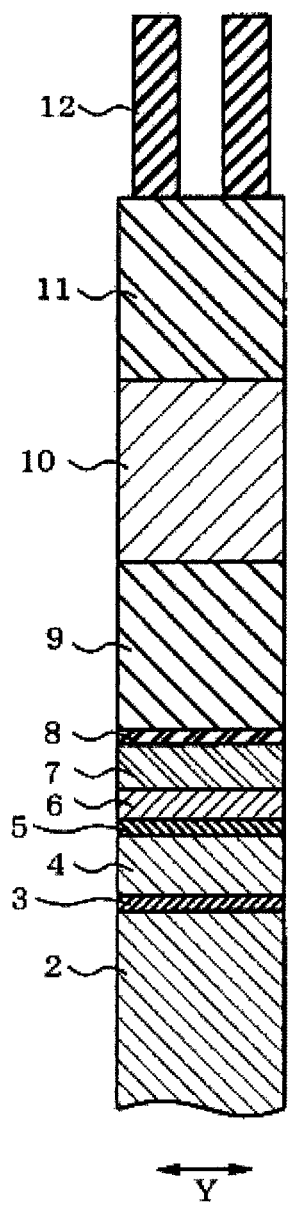
FIGS. 6A to 6C show longitudinal side views showing a state of the fabrication process following FIGS. 5A to 5C in the first embodiment.
Figure 6B:
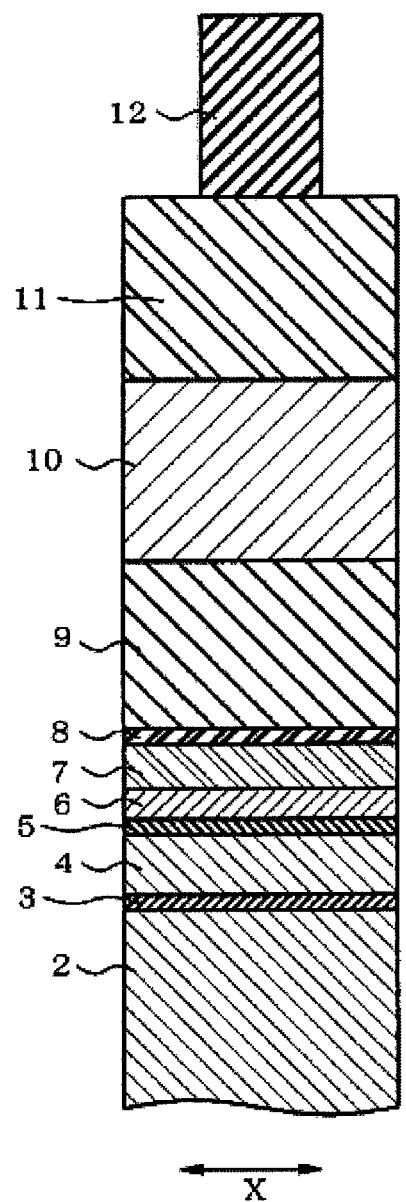
Figure 6C:
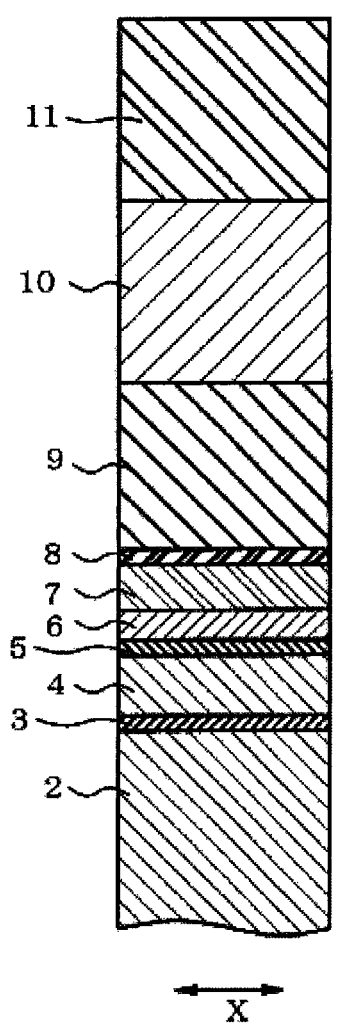

The antireflection film 13 is then removed by wet etching by using dilute hydroflouoric acid (DHF) as shown in FIG. 6A to FIG. 6C.

Figure 7A:
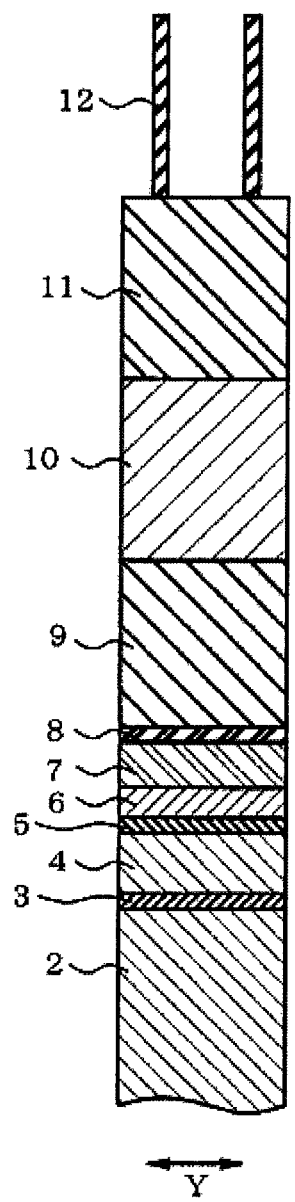
FIGS. 7A to 7C show longitudinal side views showing a stage of the fabrication process following FIGS. 6A to 6C in the first embodiment.
Figure 7B:
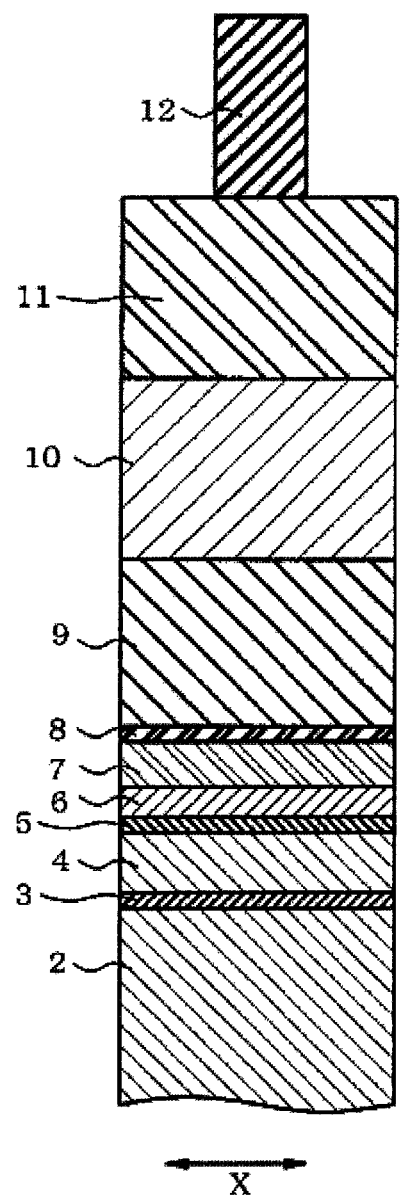
Figure 7C:
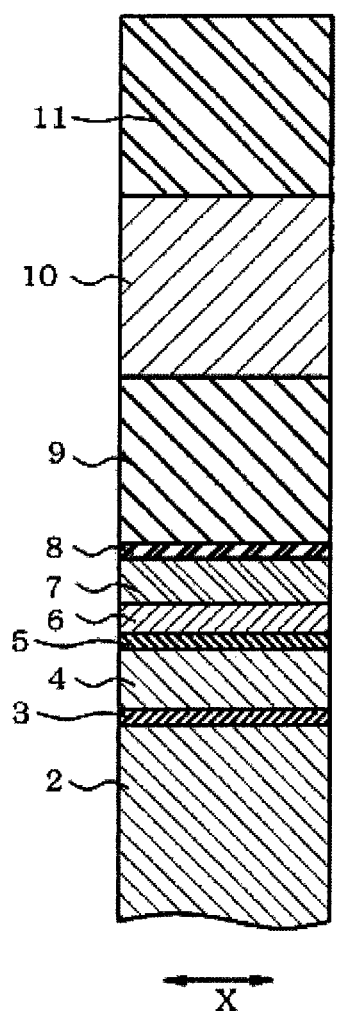

Next, the hard mask 12 is slimmed by wet etching or dry etching processing to the size thereof shown in FIG. 7A to FIG. 7C. In the cross section shown in FIG. 7A, the width of the hard mask 12 may be formed at a minimum width which exceeds the resolution limit of the usual lithography technology.

Figure 8A:
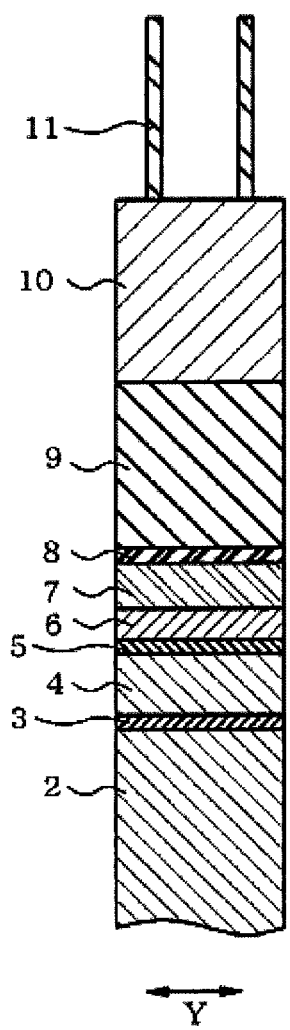
FIGS. 8A to 8C show longitudinal side views showing a stage of the fabrication process following FIGS. 7A to 7C in the first embodiment.
Figure 8B:
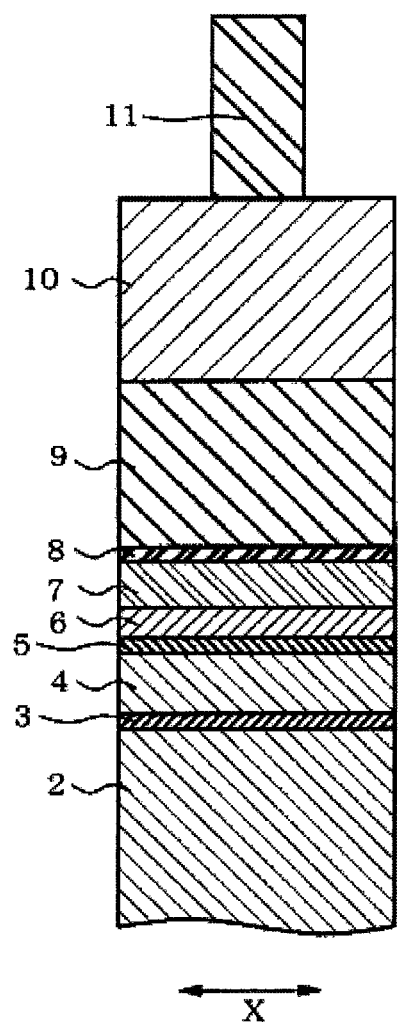
Figure 8C:
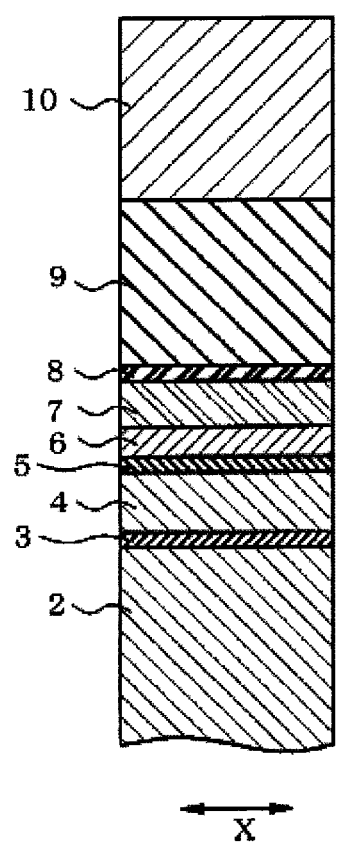
Figure 9:
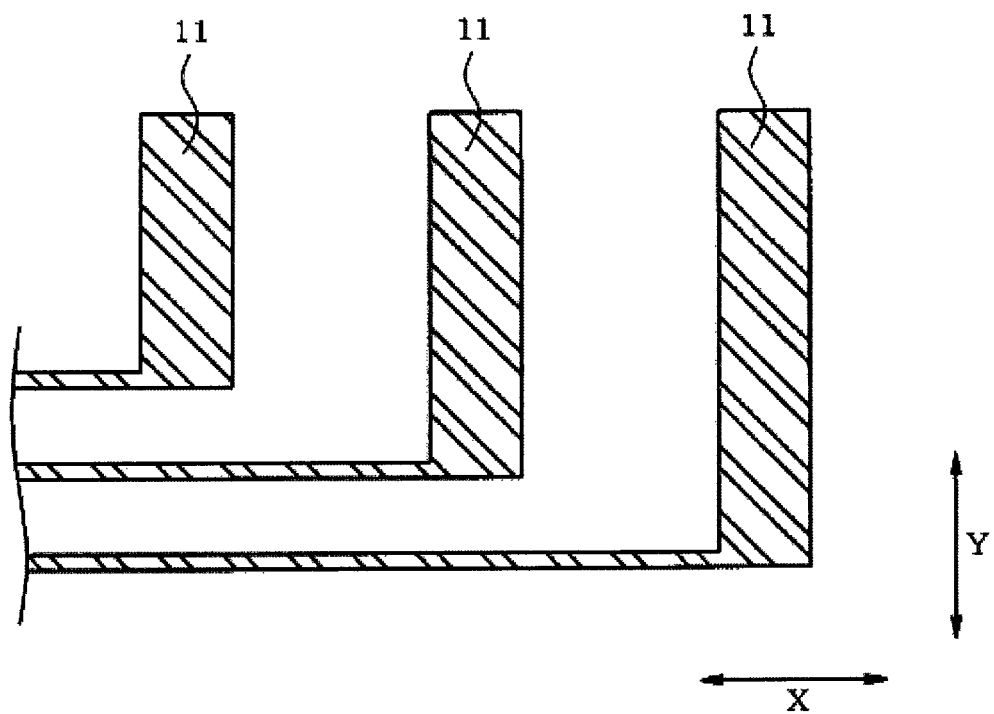
FIG. 9 is an equivalent of FIG. 3 showing the structure of the essential part in the fabricating stage of the first embodiment shown in FIGS. 8A to 8C.

The hard mask 12 pattern is then transferred into the underlying silicon nitride film 11 by etching of the silicon nitride film 11, as shown in FIG. 8A to FIG. 8C. FIG. 9 shows the patterning area of the silicon nitride film 11 in this fabrication step. As shown in this FIG. 9, the silicon nitride film 11 is patterned similarly to the planar structure of a plurality of the fringe pattern pads FP2 shown in FIG. 3. The pattern on the memory cell MC side of this silicon nitride film 11 is equivalent to the core pattern, and the edge part is equivalent to the fringe mask pattern.

Figure 10A:
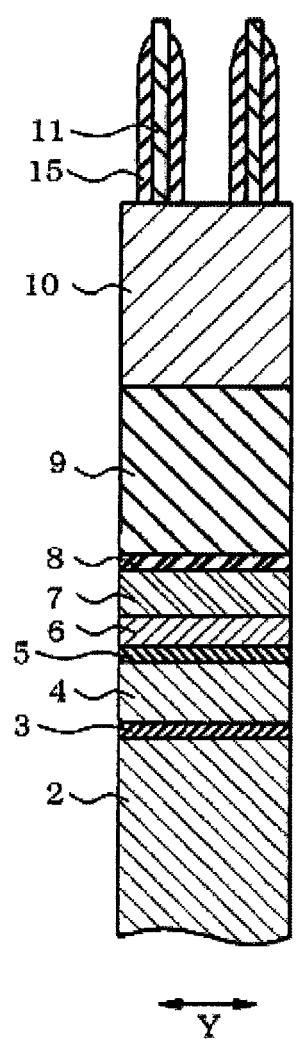
FIGS. 10A to 10C show longitudinal side views showing the stage of the fabricating process following FIGS. 8A to 8C in the first embodiment.
Figure 10B:
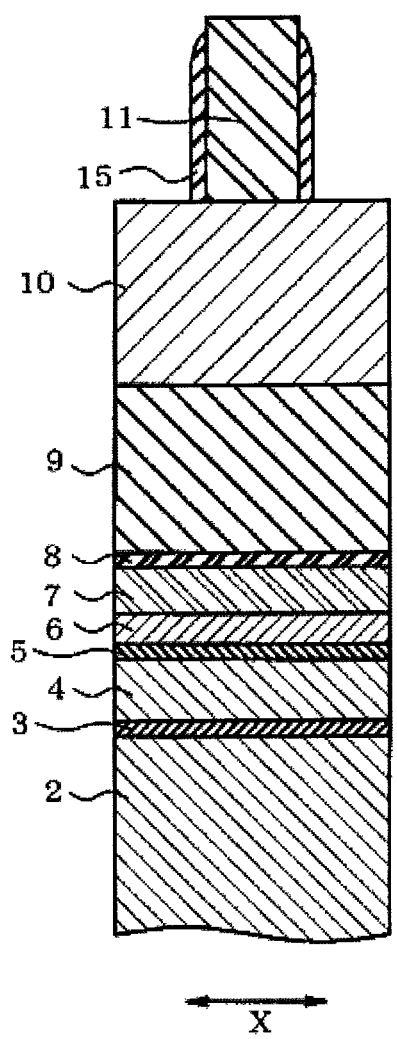
Figure 10C:
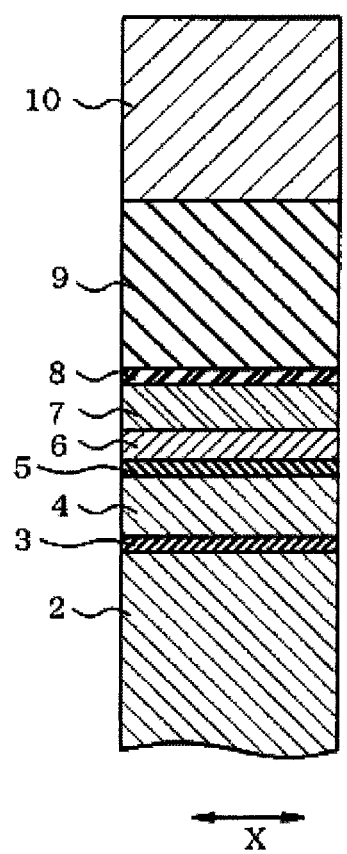

Next, a silicon dioxide film 15 is formed along the sidewall of the silicon nitride film 11 as shown in FIG. 10A to FIG. 10C. This silicon dioxide film 15 is deposited along the upper face and the side face of the silicon nitride film 11 by the CVD method, and is then anisotropically etched to remain along the sidewall of the silicon nitride film 11.

Figure 11:
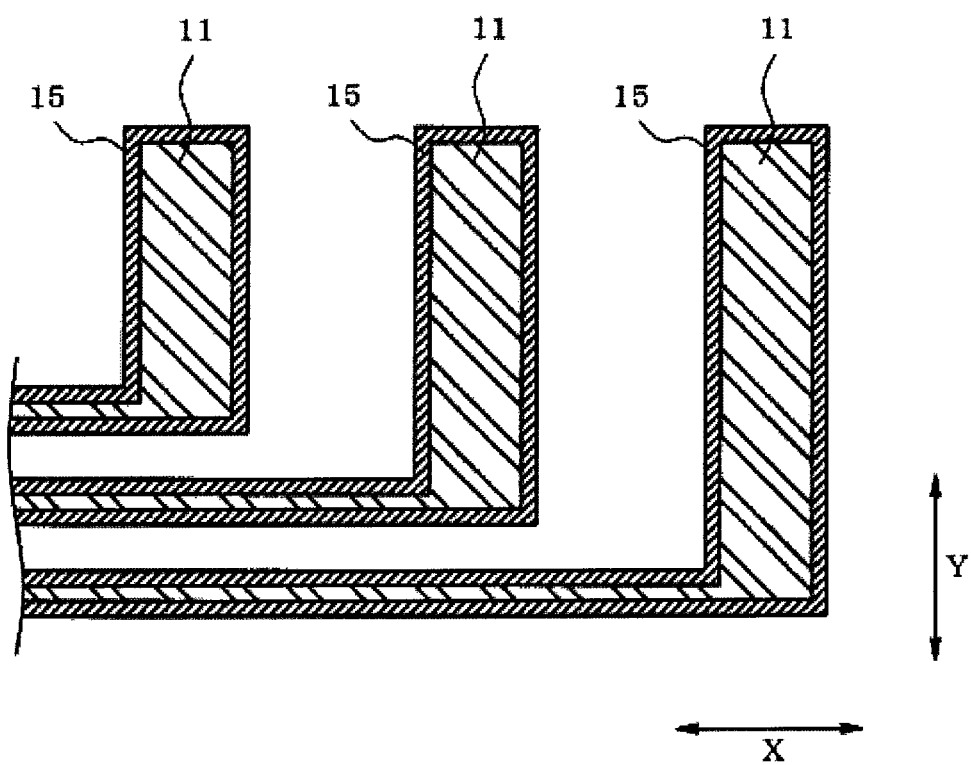
FIG. 11 is an equivalent of FIG. 3 showing the structure of the essential part in the fabricating stage of the first embodiment shown in FIGS. 10A to 10C.

FIG. 11 shows the formation region of the silicon nitride film 11 and the silicon dioxide film 15 in this fabrication stage in a plan view, and the silicon dioxide film 15 is formed as a spacer along the entire sidewalls of the silicon nitride film 11, along the area of fringe pattern pads FP2 and the adjacent connection lines ps leading to fringe pattern pads FP1 and FP3.

Figure 12A:
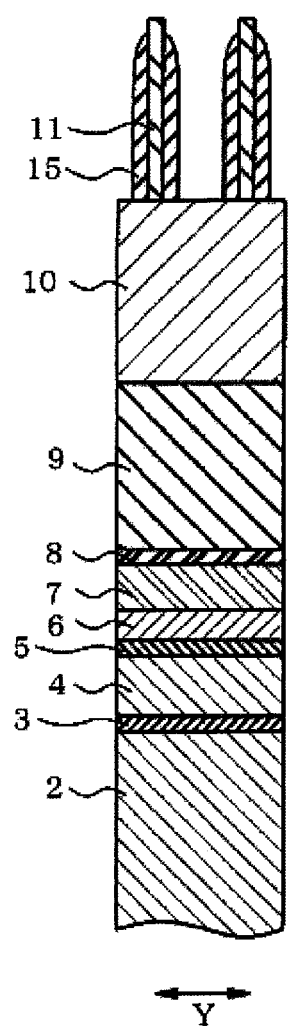
FIGS. 12A to 12C show longitudinal side views showing the stage of the fabricating process following FIGS. 10A to 10C in the first embodiment.
Figure 12B:
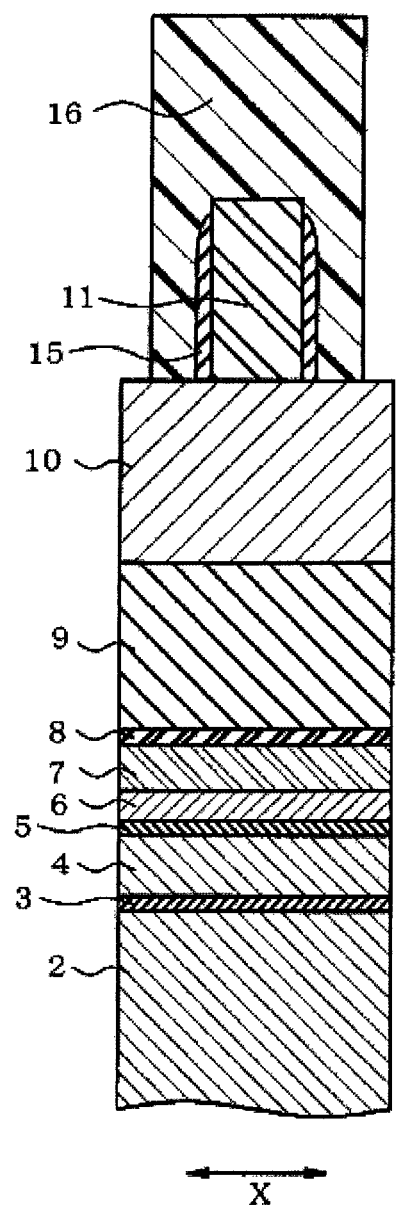
Figure 12C:
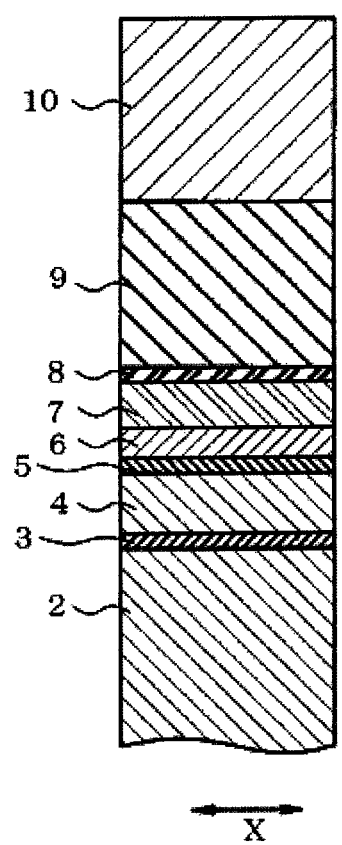
Figure 13:
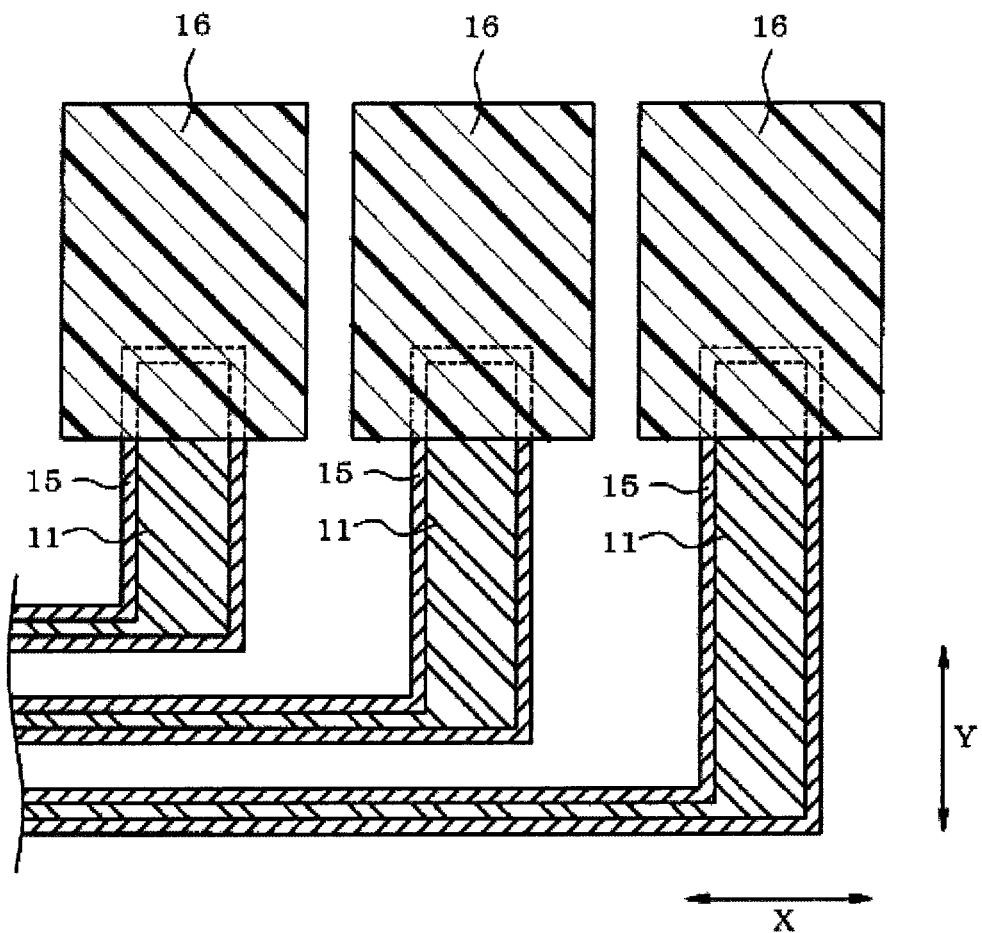
FIG. 13 is an equivalent of FIG. 3 showing the structure of the essential part in the fabricating stage of the first embodiment shown in FIGS. 12A to 12C.

Next, as shown in FIG. 12A to FIG. 12C, the resist pattern 16 (the first mask pattern) is formed by coating and patterning the resist. This resist pattern 16 is patterned only over the area with which a part of the silicon nitride film 11 and a part of the silicon dioxide film 15 are covered as shown in FIG. 13. This resist pattern 16 is also patterned over the area with which a portion of the region shown in FIG. 10B, over the portion of the deposited layers 2 to 15 where the individual fringe pattern pads FP2 will be formed. This resist pattern 16 is provided to protect the region of the substrate where the fringe pattern pads FP1 and FP3 and the connector lines P2 to P4 of the bend and offset part $WL_{c1}$ and $WL_{c3}$ will be located (see FIG. 3).

Figure 14A:
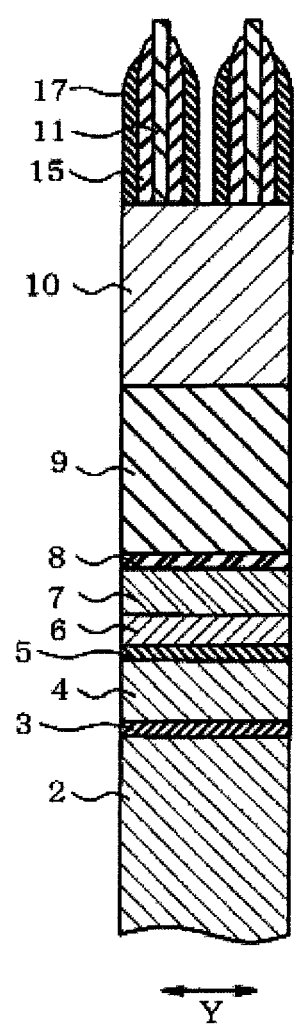
FIGS. 14A to 14C show longitudinal side views showing the stage of the fabricating process following FIGS. 12A to 12C in the first embodiment.
Figure 14B:
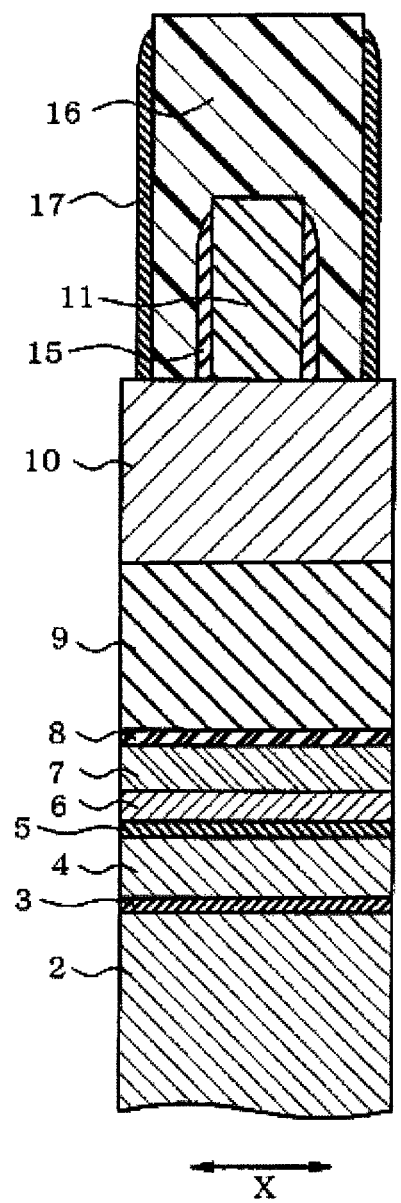
Figure 14C:
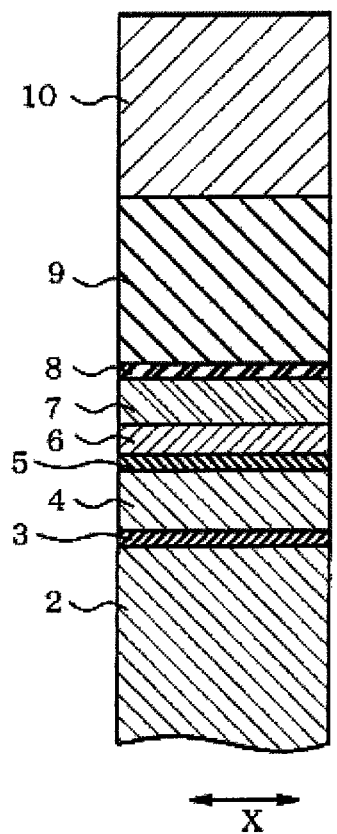
Figure 15:
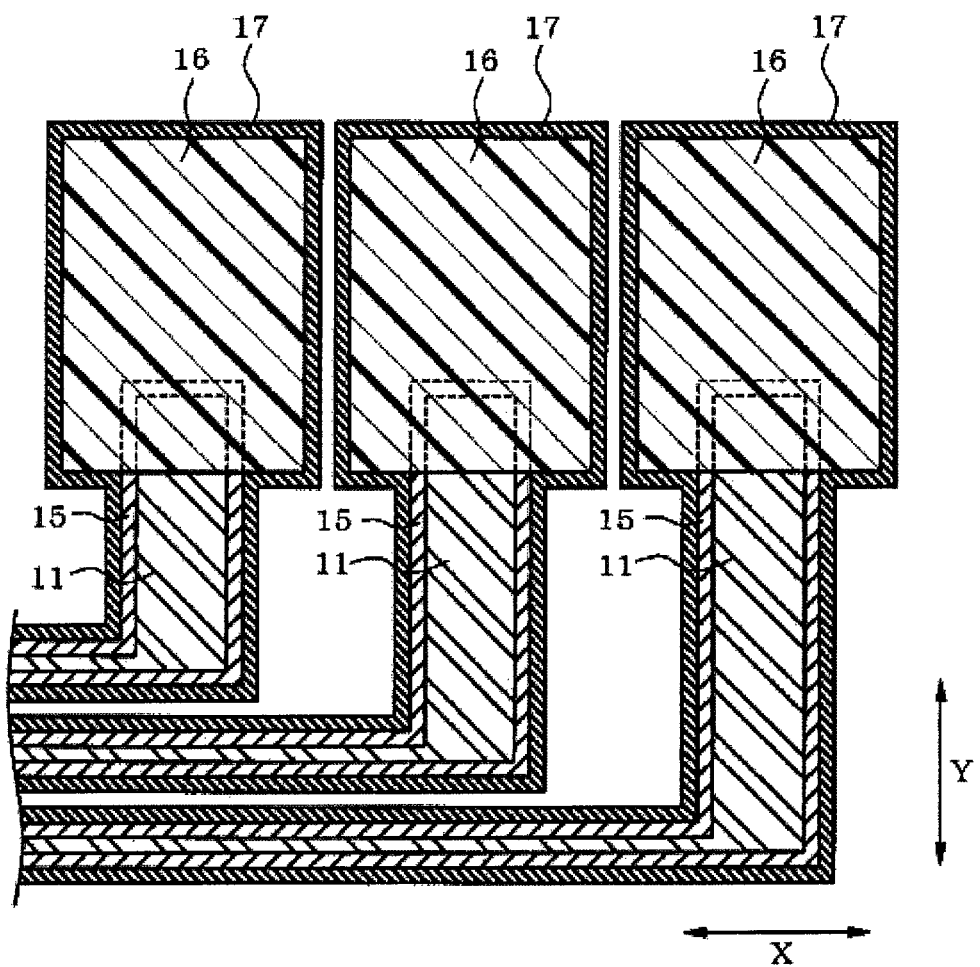
FIG. 15 is an equivalent of FIG. 3 showing the structure of the essential part in the fabricating stage of the first embodiment shown in FIGS. 14A to 14C.

Next, the silicon nitride film 17 is formed along the sidewall of the resist pattern 16 as shown in FIG. 14A to FIG. 14C. This silicon nitride film 17 is deposited by an ALD method under a low temperature that the resist organic film is able to tolerate (for instance, at 80° C.). This silicon nitride film 17 is then processed by anisotropic etching by the RIE method, and the silicon nitride film 17 which has deposited on the top and base of the features is removed. As a result, the silicon nitride film 17 remains along the sidewall of the resist pattern 16 and is formed as the outside sidewall pattern. A planar formation area of this silicon nitride film 17 is nearly in the same region with the formation area of the word lines $WL_{3n}$ and $WL_{3n+2}$ (see FIG. 3) as shown in the plan view of this fabrication step in FIG. 15.

Moreover, in this fabrication step, the silicon nitride film 17 is also formed, over the portion of the resist 16 formed over the region outwardly of the area where the fringe pads FP2 will be formed, and thus over the region where fringe pattern pads FP1 and FP3, and the corresponding connecting lines to the word lines $WL_{3n}$ and $WL_{3n+2}$ will be formed. In this region, the silicon nitride film 17 remaining on the sidewalls of the resist after etch back of the film forms a loop around the resist rectangular resist pattern. As a result, the silicon nitride film will trace a circuitous, or bending path for the connecting lines p2-p4 connecting the fringe pattern pads FP1 and FP3 with the word lines $WL_{3n}$ and $WL_{3n+2}$, not shown in the diagram.

Figure 16A:
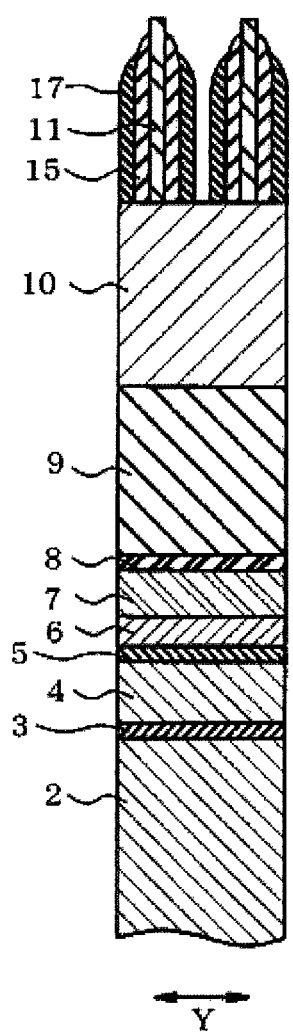
FIGS. 16A to 16C show longitudinal side views showing the stage of the fabricating process following FIGS. 14A to 14C in the first embodiment.
Figure 16B:
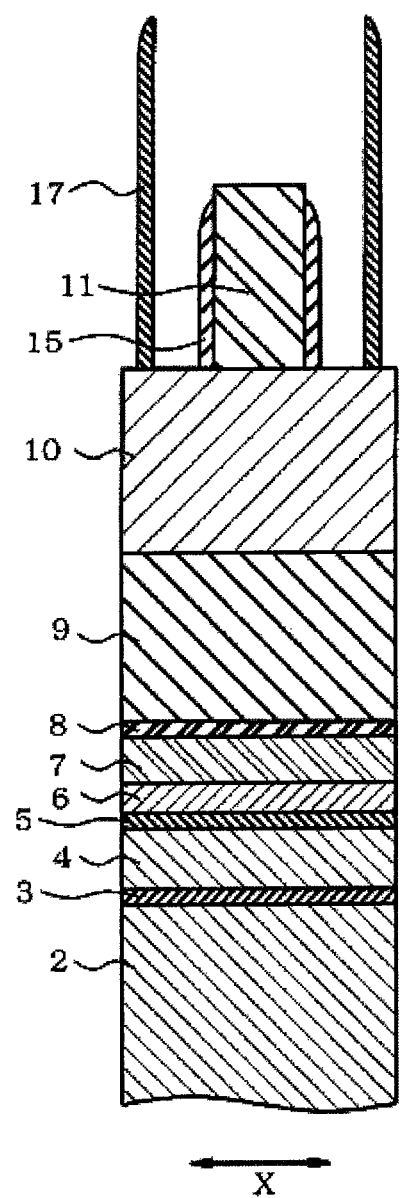
Figure 16C:
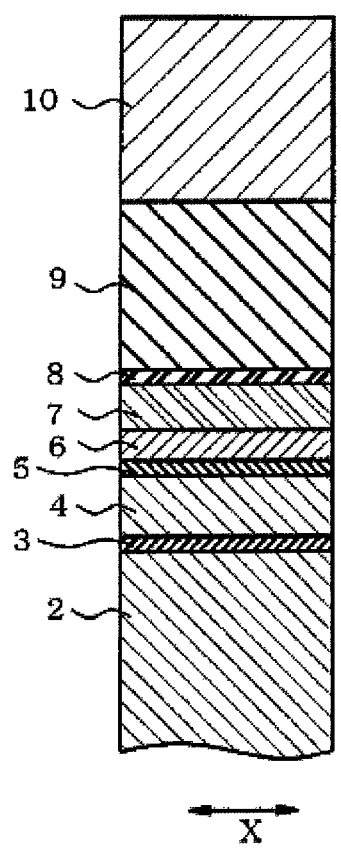
Figure 17:
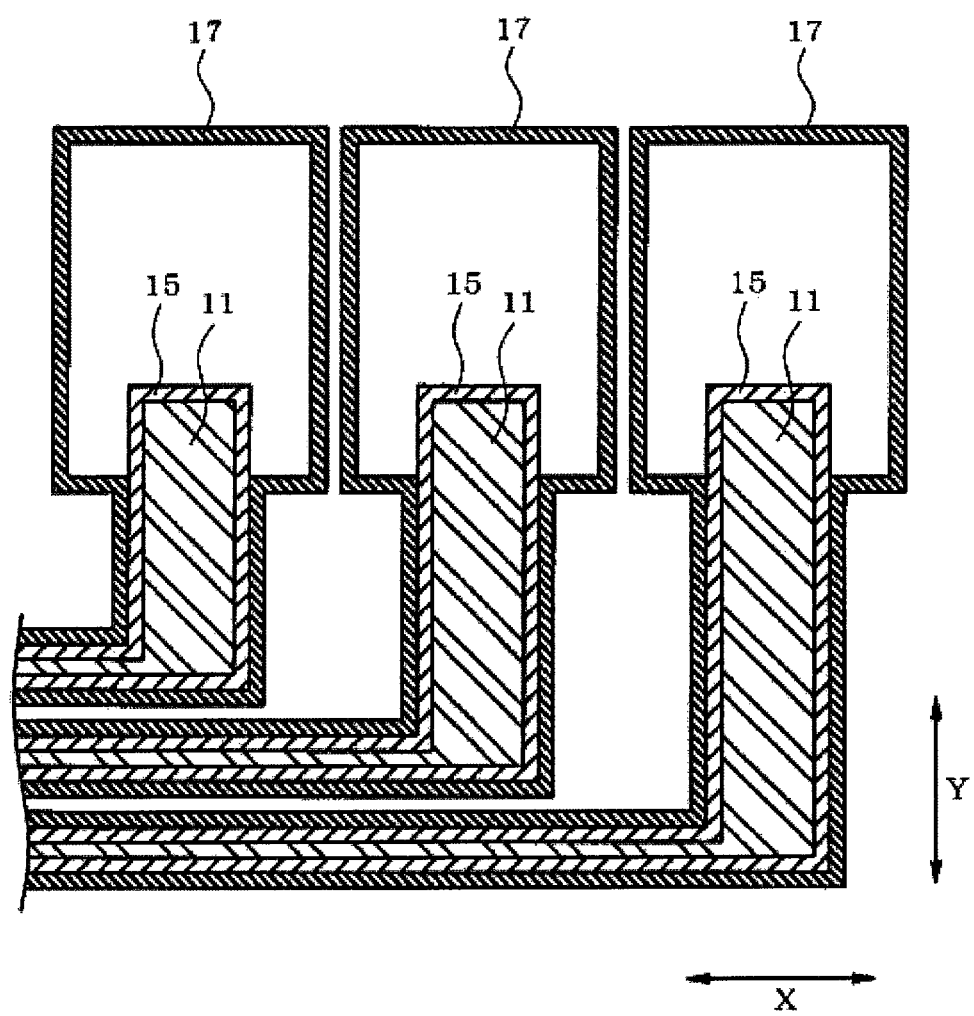
FIG. 17 is an equivalent of FIG. 3 showing the structure of the essential part in the fabricating stage of the first embodiment shown in FIGS. 16A to 16C.

Next, as shown in FIG. 16A to FIG. 16C, the resist pattern 16 is selectively removed such as by exposure thereof to a liquid solvent, or by exposure to oxygen (ashing). As a result, as shown in FIG. 17B, the silicon dioxide film 15 and a part of the silicon nitride film 11 covered by the previous step are completely exposed, and a thin walled box shaped loop of silicon nitride remains in place over the region of the fringe area where the resist 16 had been formed.

Figure 18A:
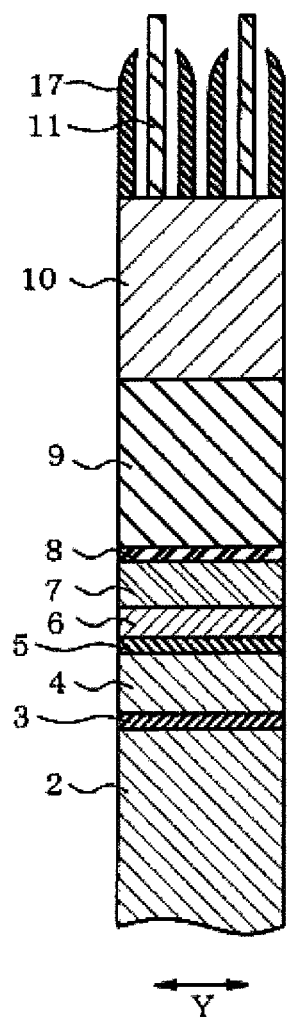
FIGS. 18A to 18C show longitudinal side views showing the stage of the fabricating process following FIGS. 16A to 16C in the first embodiment.
Figure 18B:
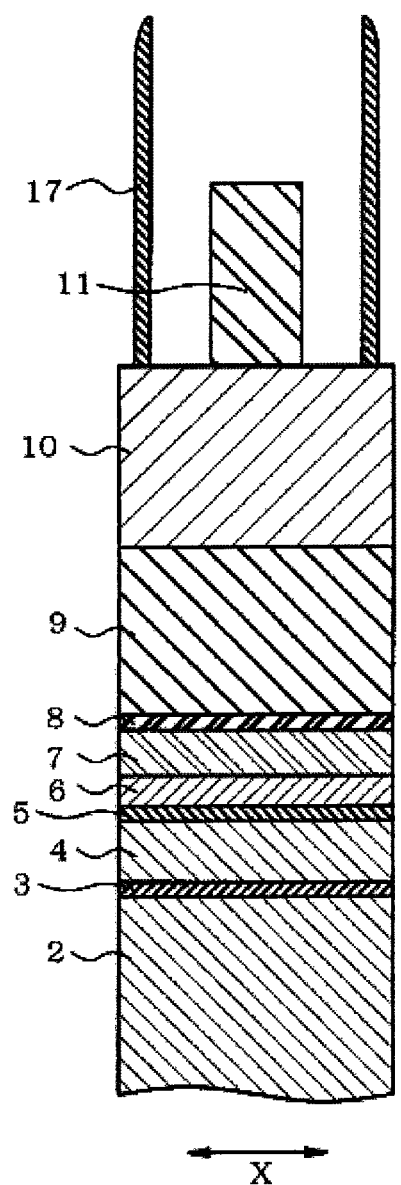
Figure 18C:
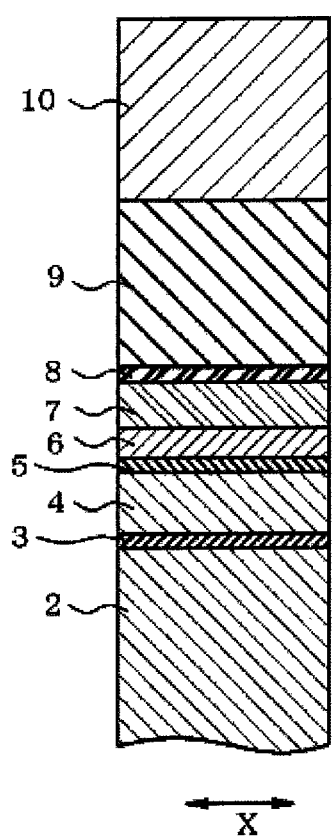
Figure 19:
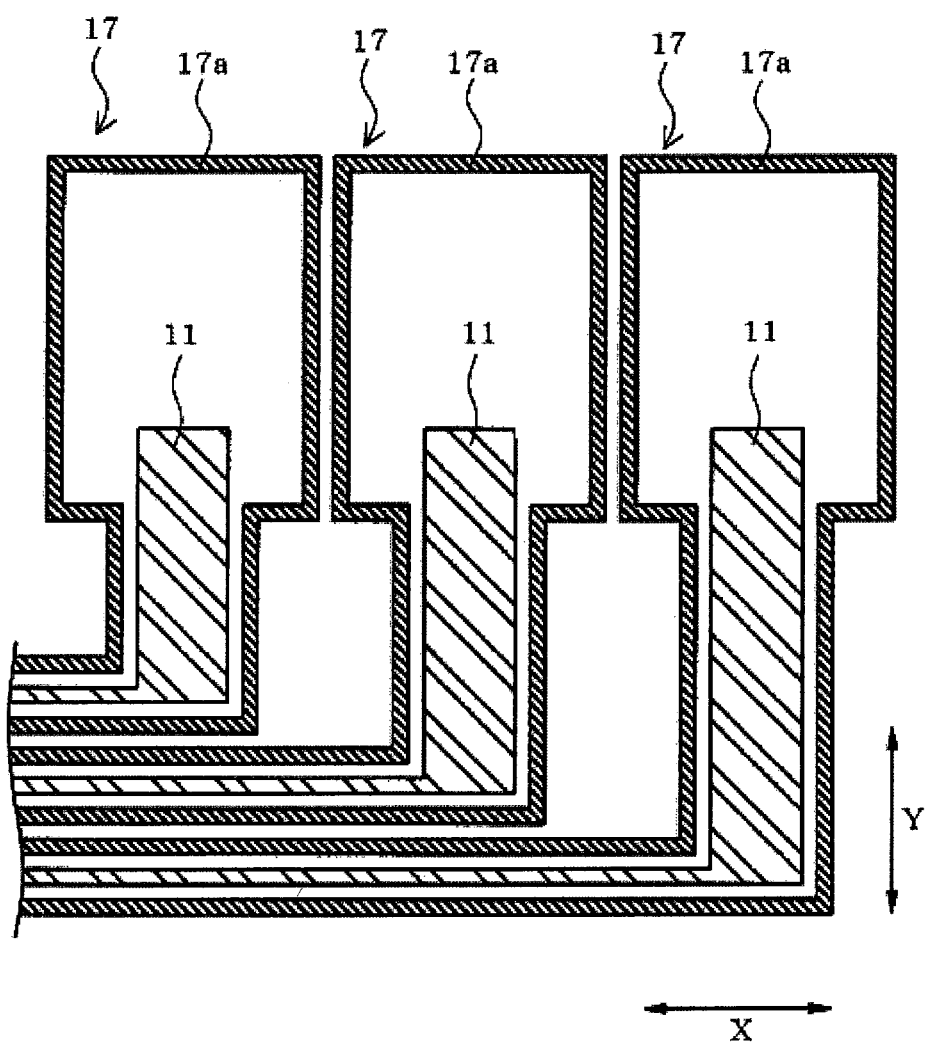
FIG. 19 is an equivalent of FIG. 3 showing the structure of the essential part in the fabricating stage of the first embodiment shown in FIGS. 18A to 18C.

Next, the silicon dioxide film 15 is removed by wet etching (or dry etching) as shown in FIG. 18A to FIG. 18C. Thus, as shown in FIG. 19, the silicon dioxide film 15 between the sidewalls of the silicon nitride film 11 and the sidewalls of the silicon nitride film 17 are removed, so there are no other films that lie between the opposite sidewalls of the silicon nitride films 11 and 17. That is, the silicon dioxide film 15 functioned as a spacer in the sidewall transfer process, and is now removed.

Figure 20A:
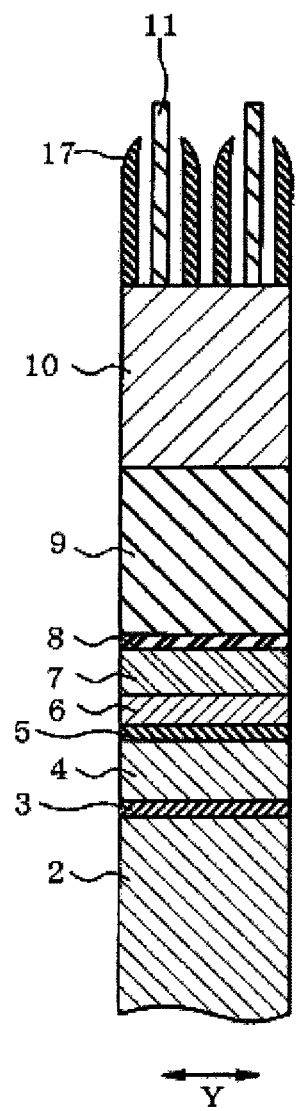
FIGS. 20A to 20C show longitudinal side views showing the stage of the fabricating process following FIGS. 18A to 18C in the first embodiment.
Figure 20B:
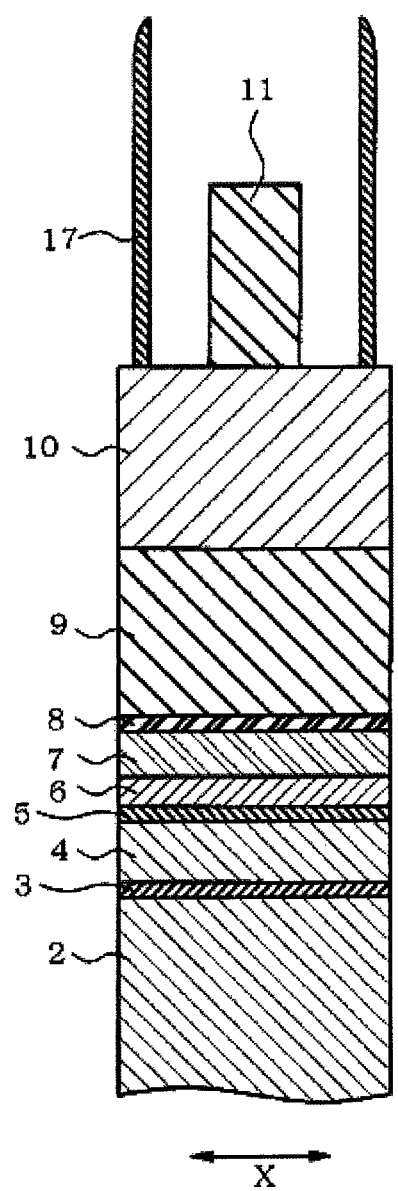
Figure 20C:
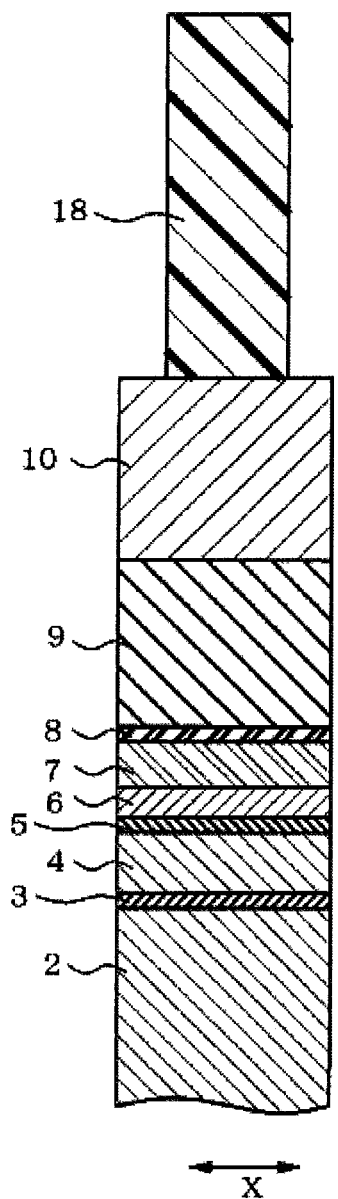
Figure 21:
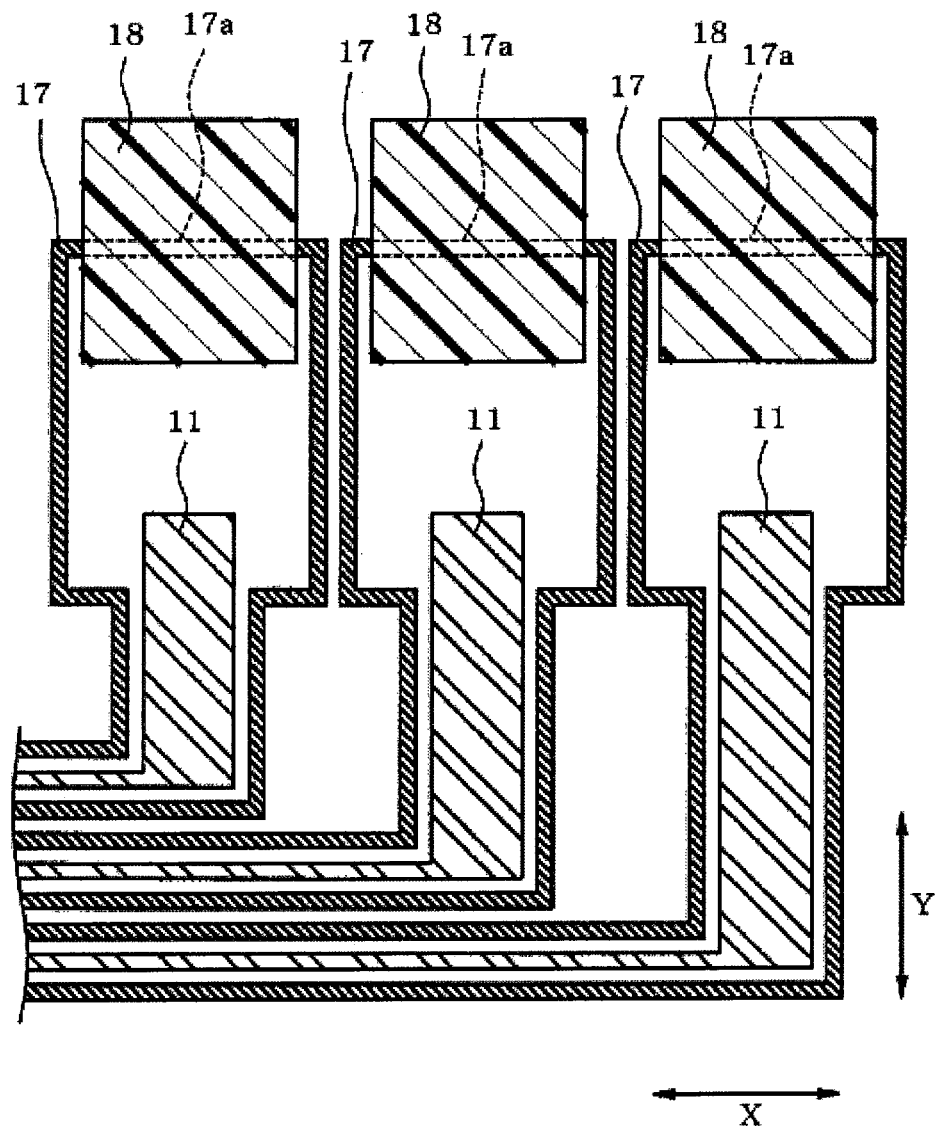
FIG. 21 is an equivalent of FIG. 3 showing the structure of the essential part in the fabricating stage of the first embodiment shown in FIGS. 20A to 20C.

Next, as shown in FIG. 20A to FIG. 20C, the resist is coated and patterned, and the resist pattern 18 (the second mask pattern) is formed (see the cross section in FIG. 20C) over the most distal point 17a of the silicon nitride film 17 as shown in FIG. 21. Therefore, the resist pattern 18 covers the loop region of the silicon nitride film 17 structured in the box or looped state. This resist pattern 18 is provided to define the outer frame in the Y direction and the outer wall frame in the X direction of the fringe pattern pads FP1 and FP3.

Figure 22A:
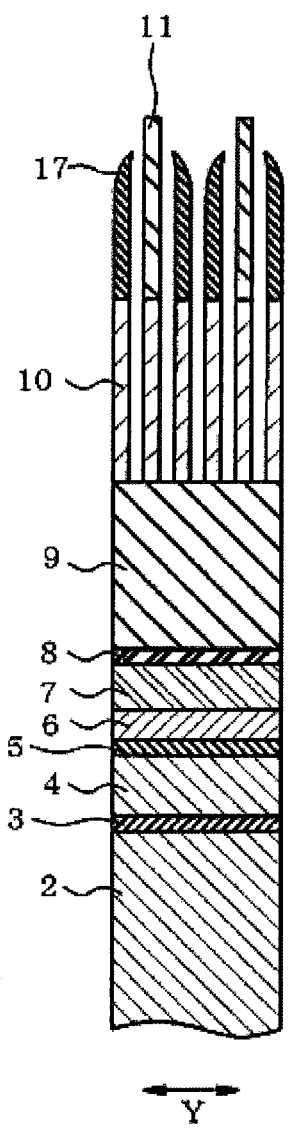
FIGS. 22A to 22C show longitudinal side views showing the stage of the fabricating process following FIGS. 20A to 20C in the first embodiment.
Figure 22B:
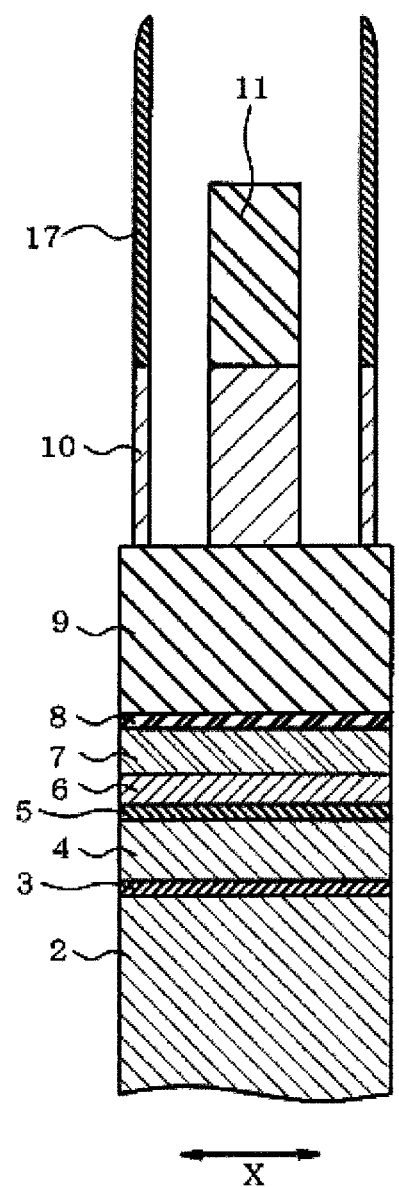
Figure 22C:
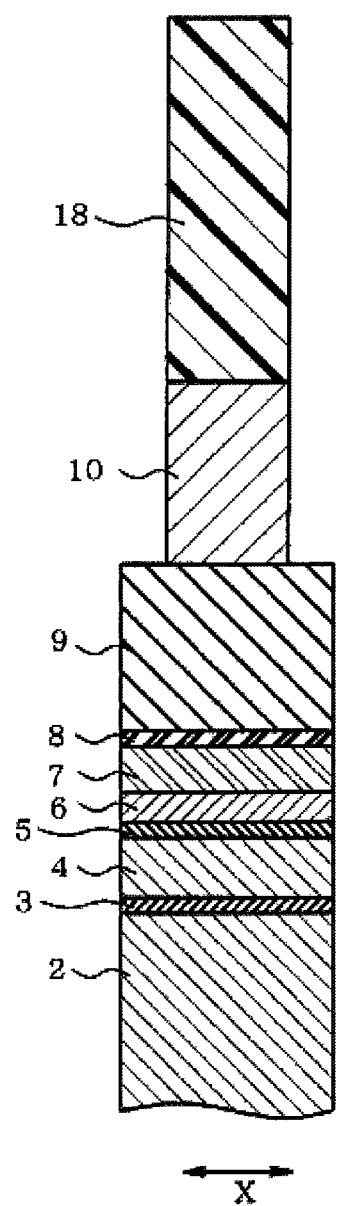
Figure 23:
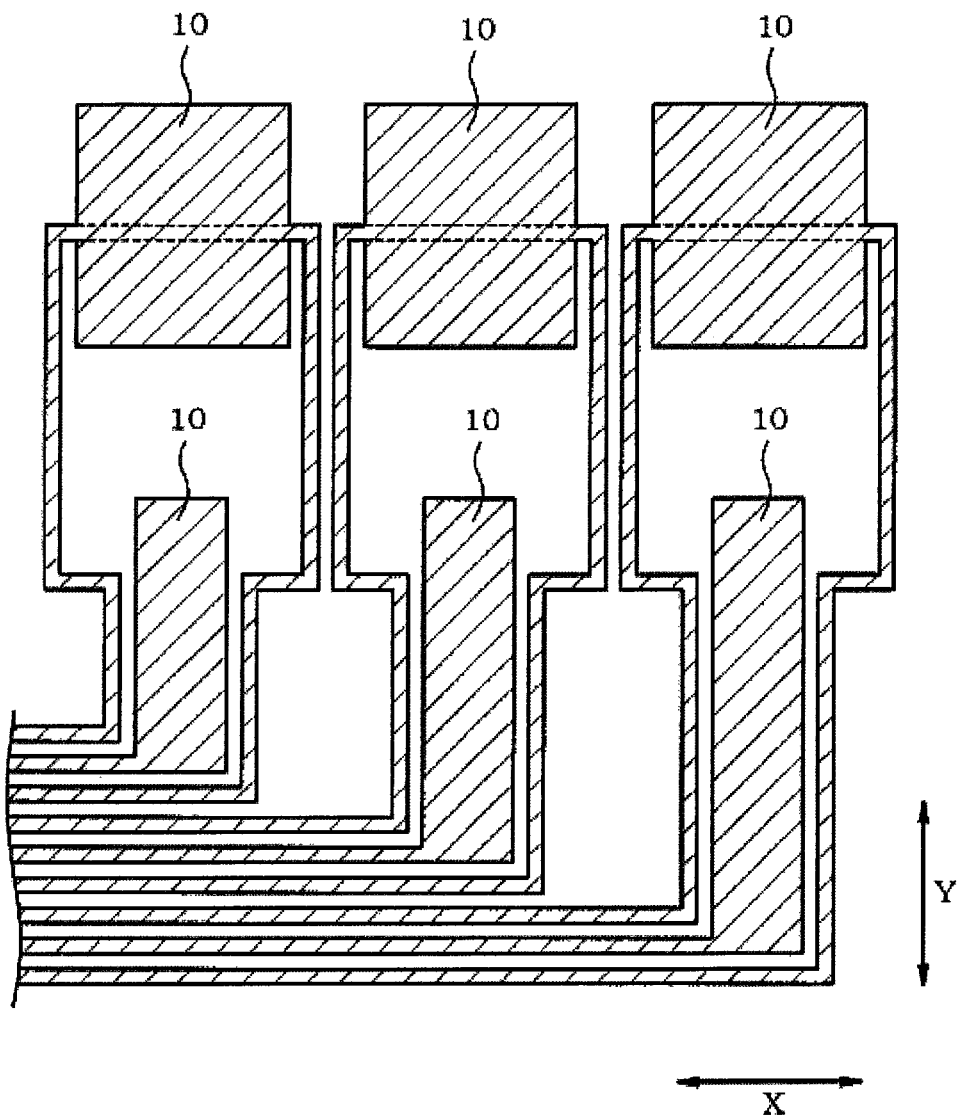
FIG. 23 is an equivalent to FIG. 3 that shows the structure of an essential part in the fabricating stage of the first embodiment of FIGS. 22A to 22C.

Next, as shown in FIG. 22A to FIG. 22C, a silicon layer 10 is selectively processed with anisotropic etching using the silicon nitride films 11 and 17 and the resist patterns 18 as a mask, according to the RIE method. Thus, as shown in FIG. 23, the silicon layer 10 remains in the regions masked by the silicon nitride films 11 and 17 and the resist pattern 18.

Figure 24A:
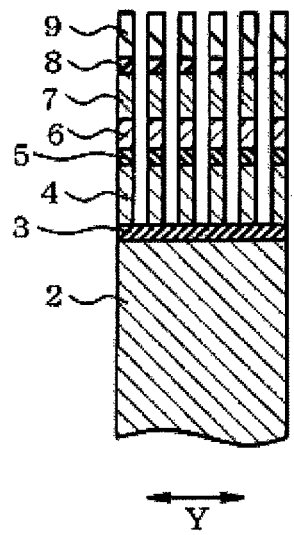
FIGS. 24A to 24C show longitudinal side views showing the stage of the fabricating process following FIGS. 22A to 22C in the first embodiment.
Figure 24B:
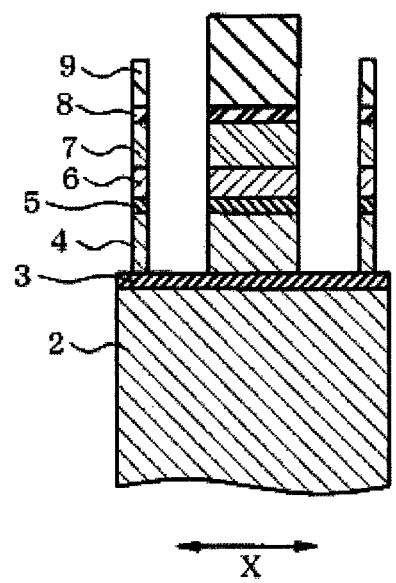
Figure 24C:
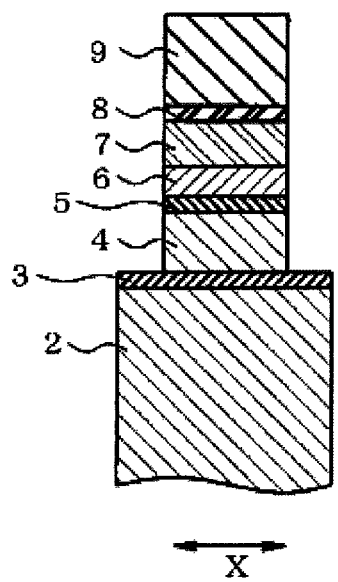

As shown in FIG. 24A to FIG. 24C, the stacked structural layers 4 to 9 making up the material films of the TEOS film 9, the silicon nitride film 8, the silicide layer 7, the silicon layer 6, the inter-electrode insulation film 5, and the floating electrode 4 are subsequently processed with anisotropic etching, using the silicon layer 10 as a hard mask. The height of the stack of the layers 4 to 9 shown in FIG. 24A and to the sides of FIG. 24B is lower than the center-layer stack of layers 4 to 9 shown in FIG. 24B, because the etch process proceeds more rapidly on thinner features than wide features, and thus the uppermost layer 9 of the thin layer stacks is significantly reduced in height as compared to that of layer 9 in the wider layer stack in FIG. 24B.

Figure 25A:
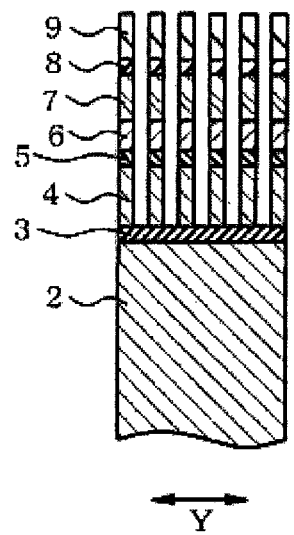
FIGS. 25A to 25C show longitudinal side views showing a stage of the fabricating process following FIGS. 24A to 24C in the first embodiment.
Figure 25B:
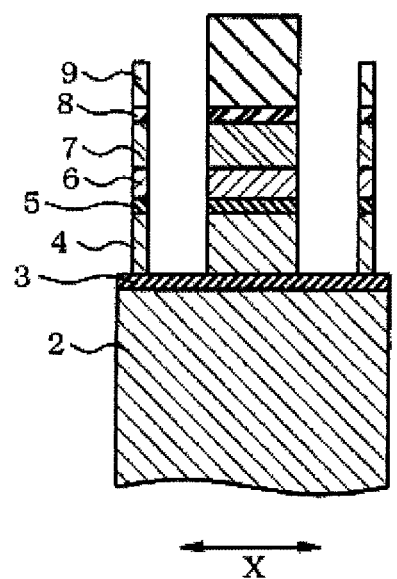
Figure 25C:
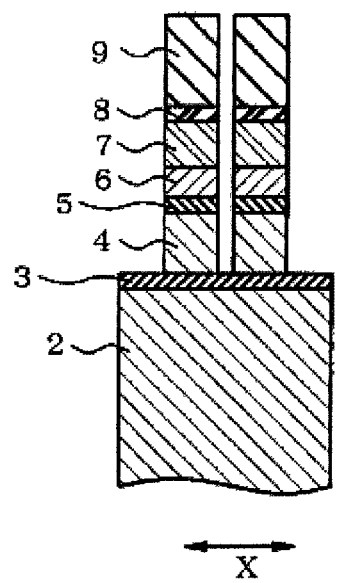

Subsequently, the portion of the stacked layers overlying the edge or peripheral region where fringe pattern pads will be formed is patterned and a trench is etched to separate the region into two smaller, side by side thin film stacks, as is shown in FIG. 25C. At this point, the material films of the silicide layer 7, the silicon layer 6, the inter-electrode insulation film 5, and the floating electrode 4 are divided in the area of the most distal point of the bend and offset parts $WL_{c1}$ and $WLc3$ of the word line. As shown in FIG. 3, this region is the farthest point is the X direction central region between the fringe pattern pads FP1 and FP3

The fringe pattern pad FP2 is disposed in the front side from the extended terminus of the connector lines P1 to P4 where the fringe pattern pads FP1 and FP3 are disposed according to this embodiment. In other words, the fringe pattern pad FP2 is disposed to the memory cell MC side rather than the fringe pattern pad FP1 and fringe pattern pad FP3 side of the device. Therefore, the formation area of the wide fringe pattern pads FP1-FP3 can be formed in a length or span in the X-direction of FIG. 3 which is shorter than where all fringe pattern pads lay in the same straight line along the X direction. Since the connector lines P1 to P4 are interconnected to the fringe pattern pads FP1 and FP3 protruding to the side of the fringe pattern pad FP2, the formation area of the wide fringe pattern pads FP1 and FP3 can be secured.

Moreover, the word line $WL_{3n+1}$ connector line projects from the vertex of the fringe pattern pad FP2 (corner). Therefore, the area of the fringe pattern pad FP2 is easily secured, and the pattern formation area can be efficiently used.

Moreover, the word lines $WL_{3n}$ and $WL_{3n+2}$, which were formed in part by pattern etching the layer stack using the silicon nitride 17 film which remained in the box or loop pattern after removal of the resist 16, into a bent and offset line pattern to form the connector lines P4, protrude from the side part, located at the edge in the X direction, of the fringe pattern pads FP1 and FP3. In such a case, even when there is a slight shift in positioning of the exposure mask when patterning the resist pattern 18 as shown in FIG. 21, the structure protruding from the connector line P4 from the edge of the fringe pattern pads FP1 and FP3 can be easily formed. Therefore, the range of tolerance can be widened for positioning of the exposure mask at the time of patterning the resist pattern 18, even where very fine lines which are beyond the capability of traditional photolithographic techniques to form are used.

In particular, even if the spacing between the adjacent connector line becomes narrow when the triple patterning is applied, a wide formation area of the fringe pattern pads FP1-FP3 can be secured. Moreover, the loop region, of linear silicon nitride film 17 is covered with the rectangular resist pattern 18, and the resist pattern 18 is processed with anisotropic etching as a mask. Therefore, the formation area of the fringe pattern pads FP1 and FP3 can be secured.

In this embodiment, silicon nitride films 11 and 17 are used as a mask material to process the fringe pattern pad FP2 and the word lines $WL_{3n}$, and $WL_{3n+2}$ of both sides, simultaneously. Since these films 11 and 17 are formed with the same kind of materials, it will be easy to adjust the width aiming at the silicon nitride films 11 and 17, and the stacked structural layers 4 to 9 will be easily processed to the target width and the target spacing.

Embodiment 2

FIG. 26 to FIG. 46 show a second embodiment. The difference from the previous embodiment is the structure of the fringe region of the fringe pattern pads FP1 and FP3. The same or similar reference codes indicate the identical or similar parts with the previous embodiment, and the explanation is omitted if necessary. A point that is different from the previous embodiment is the connection structure with the fringe pattern pad FP1 at the terminus of the word line $WL_{3n}$ and the connection structure with the fringe pattern pad FP3 at the terminus of the word line $WL_{3n+2}$. In this embodiment, the first and third connection lines P1 connect to the side of the fringe pattern pads FP! And FP# which face the fringe pattern pad FP2.

Figure 26:
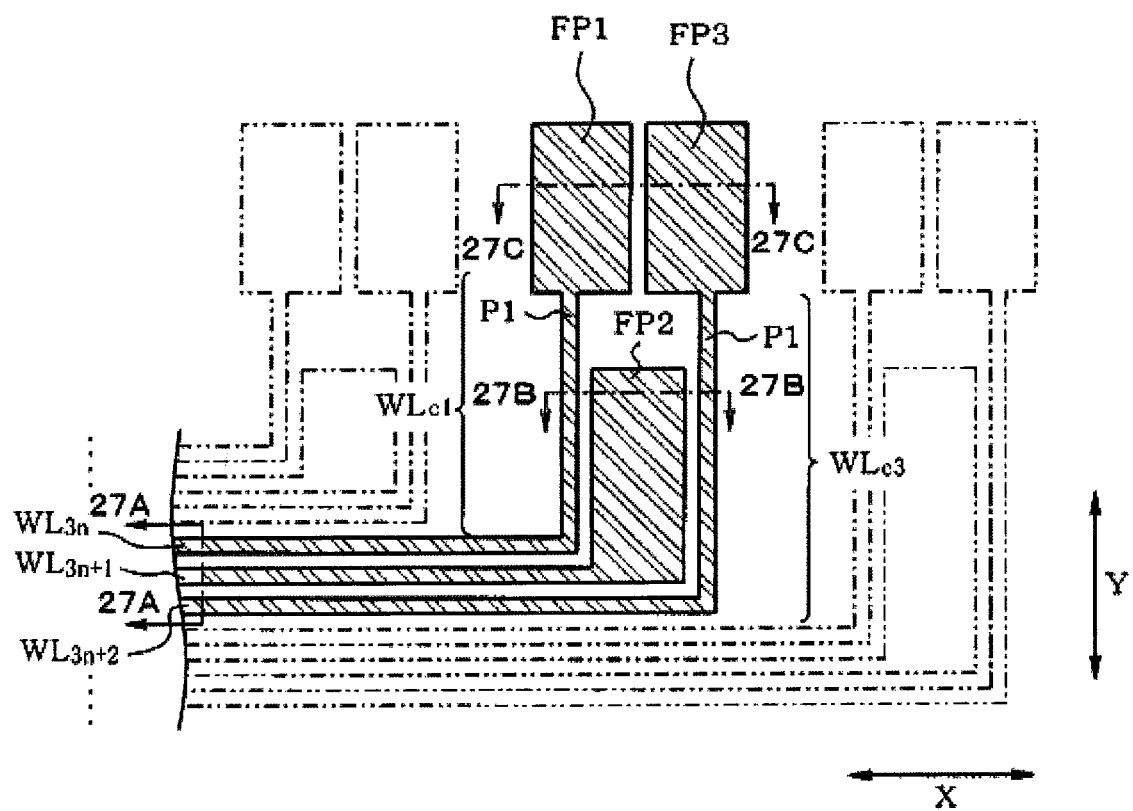
FIG. 26 is a diagram equivalent to FIG. 3 in the second embodiment.

In comparing the planar structure shown in FIG. 26 of this embodiment with the planar structure of the previous embodiment (See FIG. 3), there is no such structure equivalent to each connector line P2 to P4 for the previous embodiment. Moreover, the connector line P1 of the bend and offset part $WL_{c1}$ and $WL_{c3}$ of the word line are directly connected to the edge of the memory cell MC side in the Y direction of the respective fringe pattern pads FP1 and FP3.

As for the maximum space in the X direction between the word lines $WL_{3n}$-$WL_{3n+2}$, the maximum distance in the X direction of the structure of the previous embodiment (spacing between connector line P3) is formed wider than the maximum space in the X direction of the structure of this embodiment (spacing between connector line P1).

Figure 27A:
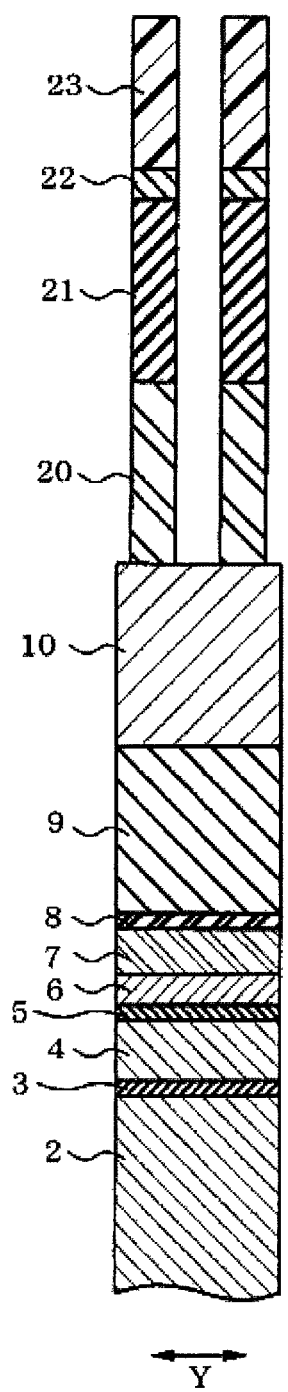
FIGS. 27A to 27C show longitudinal side views schematically showing a stage of the fabricating process in the second embodiment.
Figure 27B:
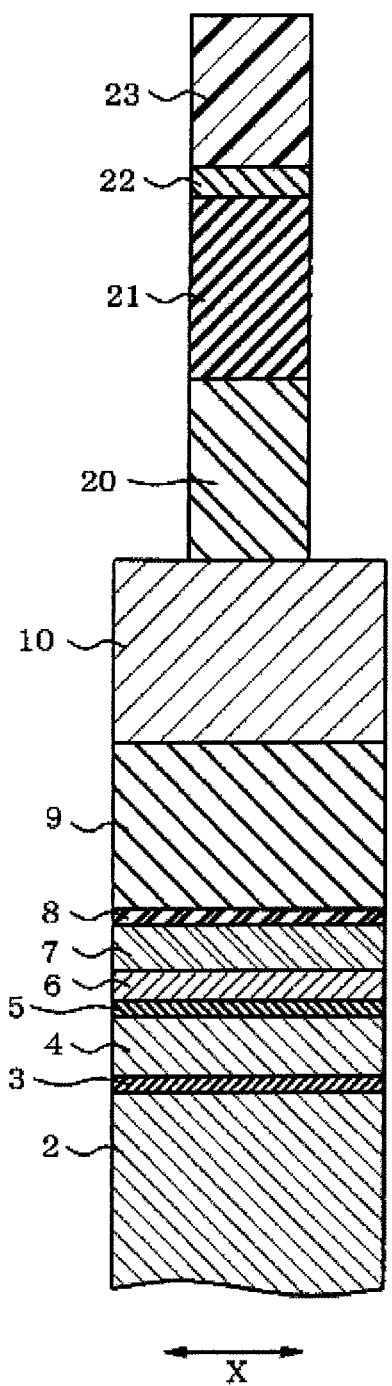
Figure 27C:
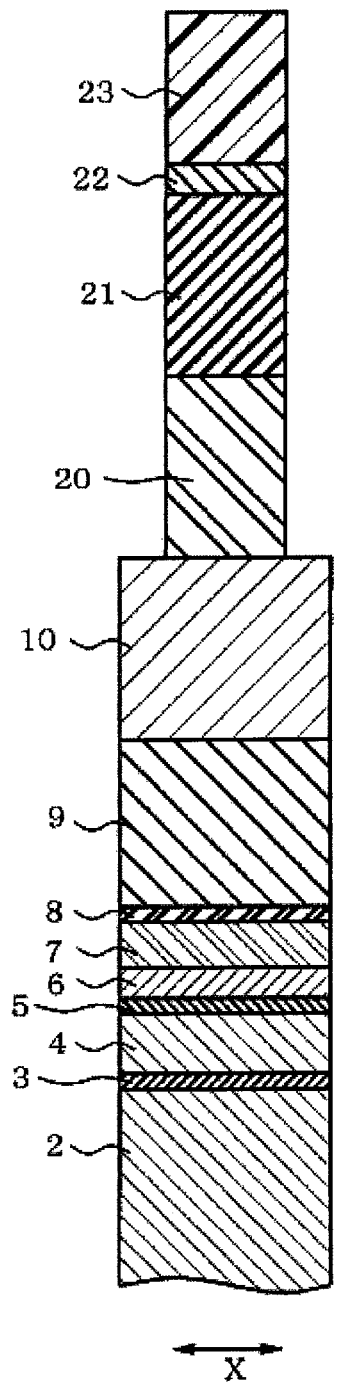

The process of fabrication of this embodiment is described by referring to the drawings after FIGS. 27A to 27C. In the following reference drawings, the diagram marked with A shows the longitudinal sectional structure along the 27A-27A line in FIG. 26. The drawing marked with B shows the longitudinal sectional structure along the 27B-27B line in FIG. 26. Moreover, the drawing marked with C shows the longitudinal sectional structure along the 27C-27C line in FIG. 26.

As shown in FIG. 27A to FIG. 27C, first, each layer 3-10 and 20-23 is stacked on the semiconductor substrate 2 in sequence. In FIGS. 27A to 27C, 20 is a TEOS based silicon oxide film, 21 is a hard mask, 22 is an antireflection coating, and 23 is a resist pattern.

The fabrication process is similar to the previous embodiment up to the deposition of the amorphous silicon layer 10. After depositing the amorphous silicon layer 10, the TEOS film 20 (silicon dioxide film) is deposited according to the CVD method, and a hard mask 21 is deposited on the dTEOS film 20 according to the coating method. Sequentially, a resist is coated over the antireflection coating 22 on the hard mask 21 e.

Figure 28:
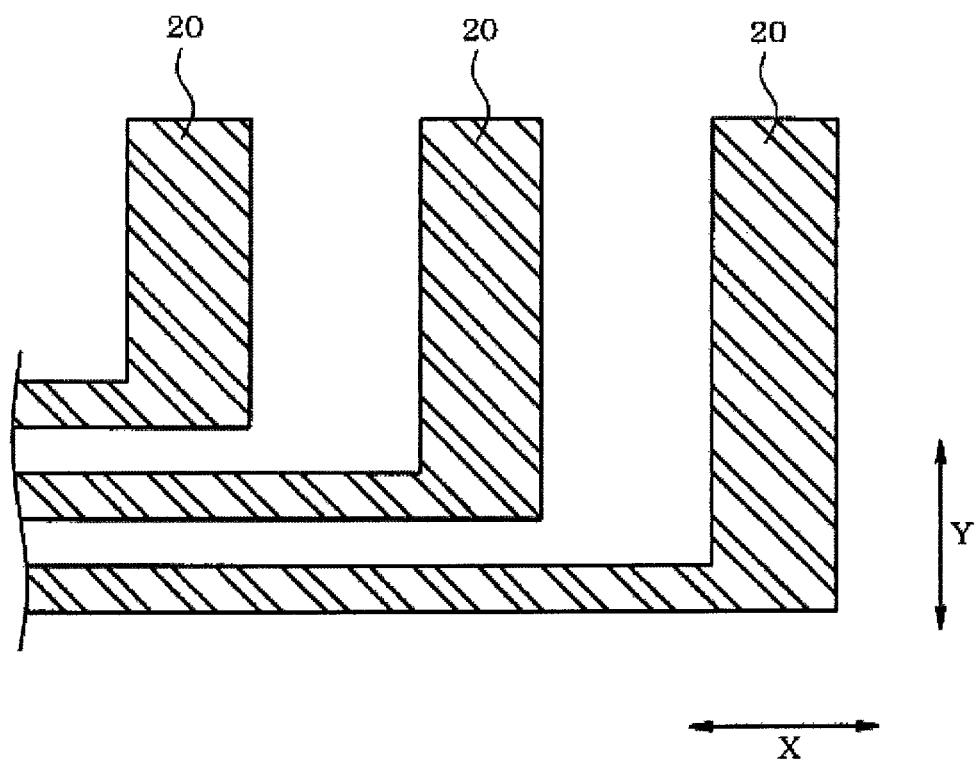
FIG. 28 is a diagram equivalent to FIG. 26 showing the structure of the essential parts in the fabrication stage of FIGS. 27A to 27C of the second embodiment.

The resist pattern 23 is then formed after exposing and developing the resist. The hard mask 21 and the TEOS film 20 are processed by anisotropic etching in sequence, using the resist pattern 23 as a mask, using a RIE method. The hard mask 21 is also etched at the same time as the etching of the TEOS film 20, the hard mask providing the mask for the etching of the TEOS layer. Thereafter, the etching residue of the hard mask 21 is removed, if necessary, by using ashing and the wet etching (sulfuric acid based). Thus, the structure shown in FIG. 27A to FIG. 27C can be formed. FIG. 28 shows the TEOS film 20 extending into the fringe area of the device, where the fringe pattern pads will be formed in this fabrication process. The minimum width of the TEOS film 20 in this fabrication step is the width at which the patterning can be performed by using the common lithography technology.

Figure 29A:
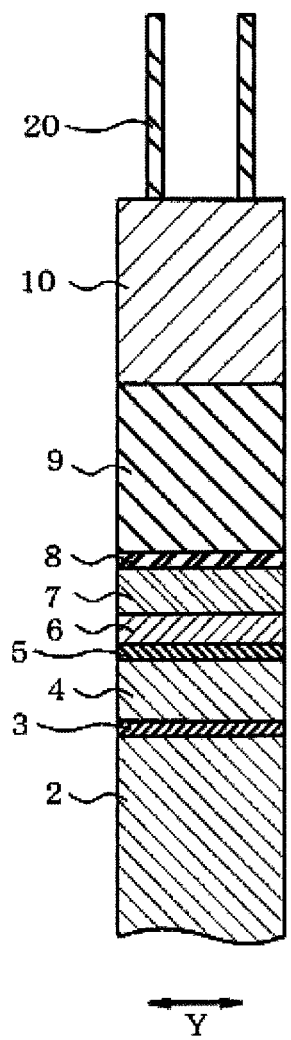
FIGS. 29A to 29C show longitudinal side views showing a stage of the fabricating process following FIGS. 27A to 27C in the second embodiment.
Figure 29B:
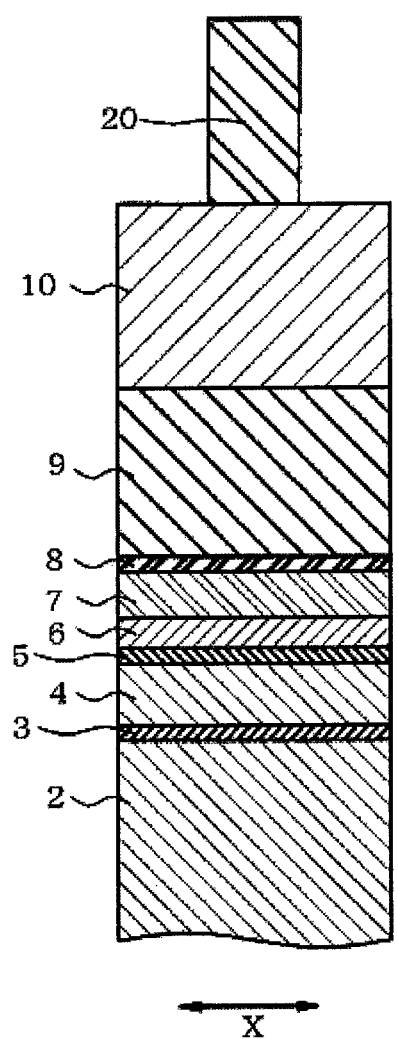
Figure 29C:
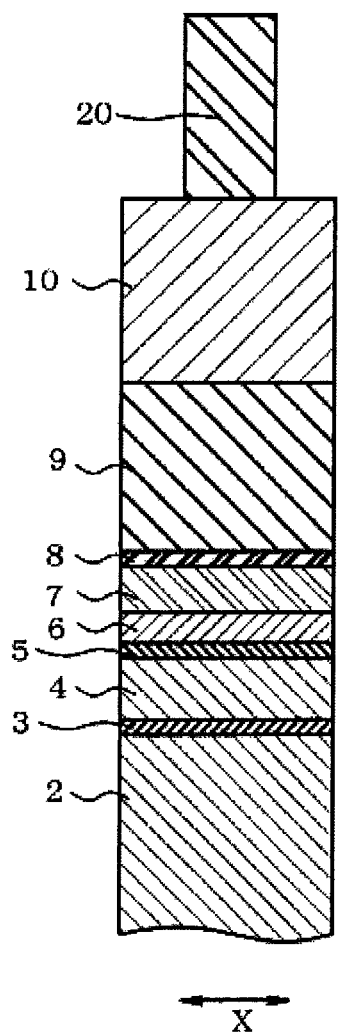
Figure 30:
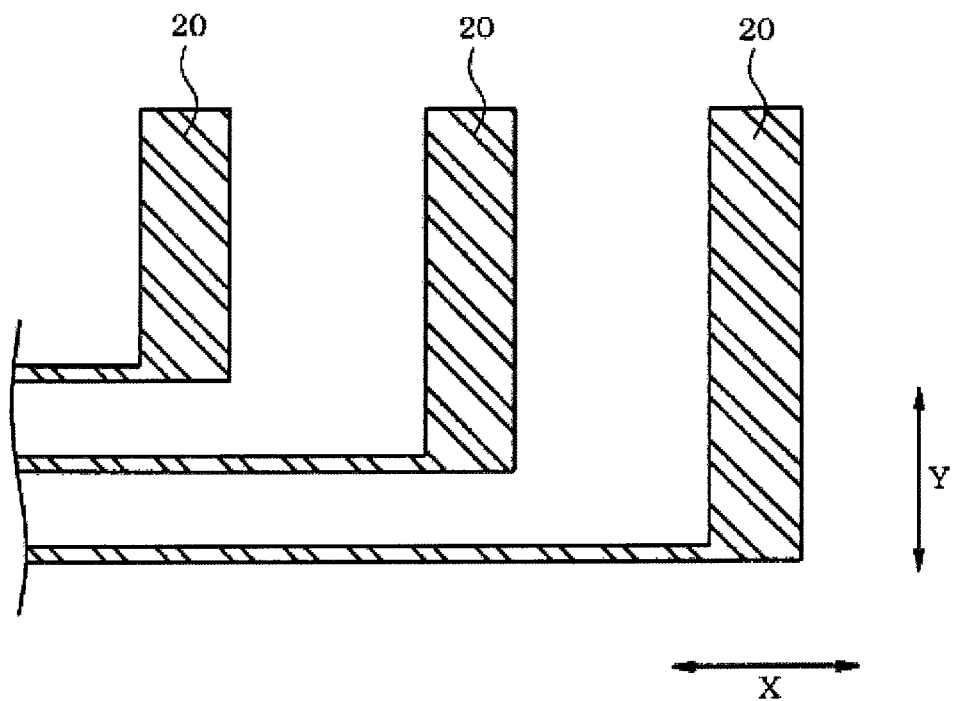
FIG. 30 is a diagram equivalent to FIG. 26 showing the structure of the essential parts in the fabrication stage of FIGS. 29A to 29C of the second embodiment.

Next, the resist pattern 23 and the antireflection coating 22 are removed by wet etching, and the TEOS film is slimmed or thinned by wet etching, to yield the structure shown in FIG. 29A to FIG. 29C. Thus, as shown in FIG. 30, the TEOS film 20 can be slimmed in both directions X and Y in this fabrication process, and formed at the minimum width exceeding the resolution limit of the usual lithography technology. This TEOS film 20 is formed as the core pattern and the fringe mask pattern in the fabrication process.

Figure 31A:
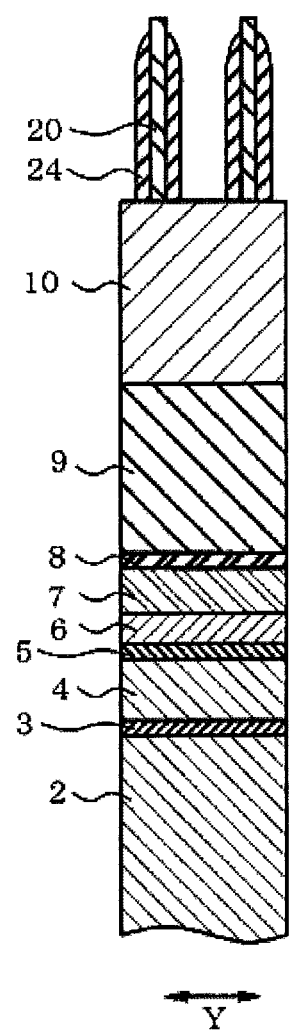
FIGS. 31A to 31C show longitudinal side views showing a stage of the fabricating process following FIGS. 29A to 29C in the second embodiment.
Figure 31B:
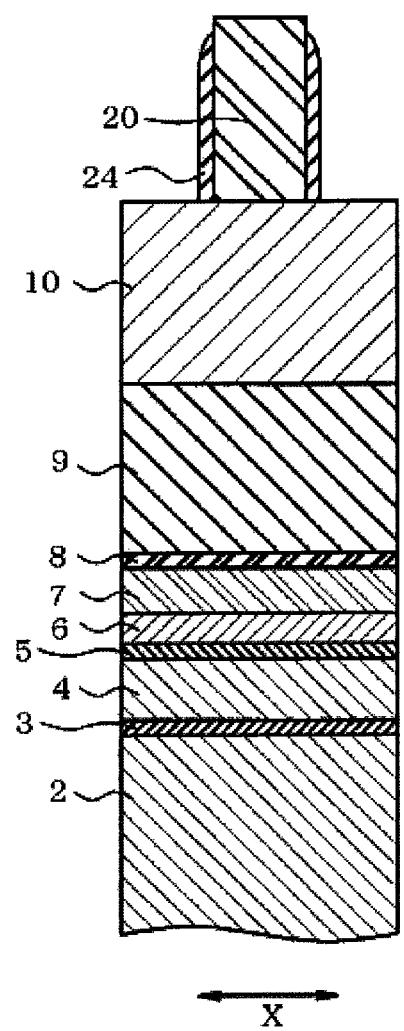
Figure 31C:
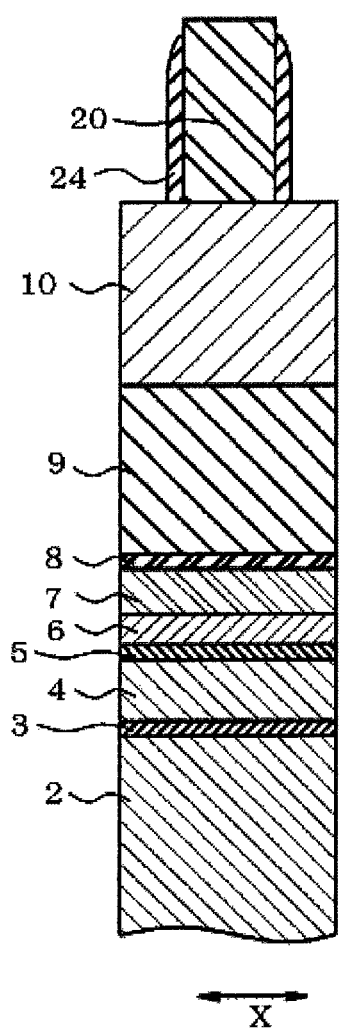
Figure 32:
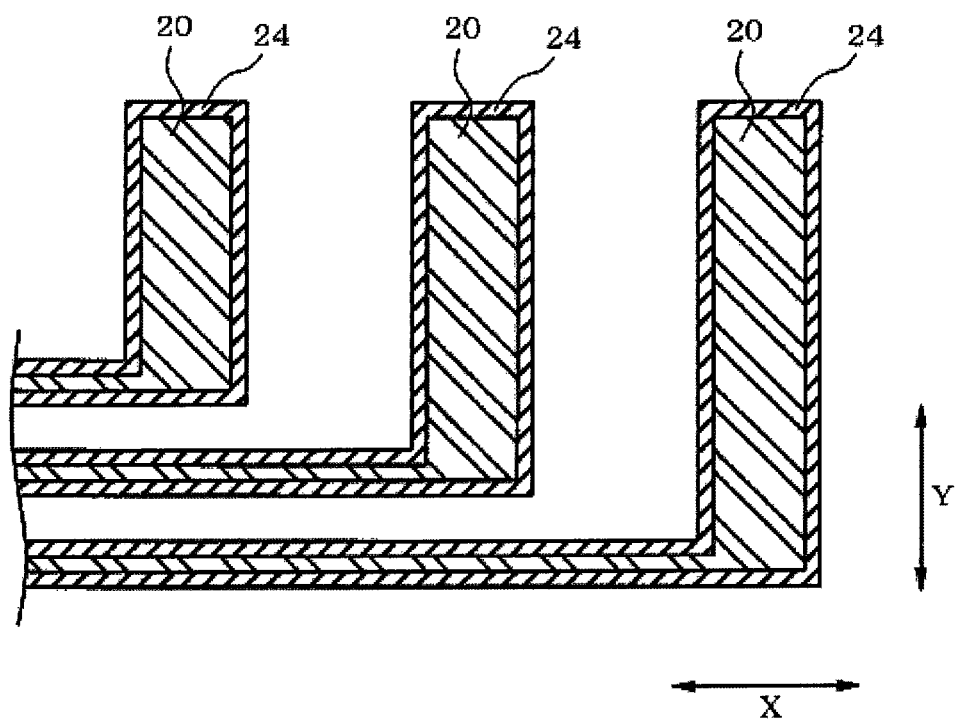
FIG. 32 is a diagram equivalent to FIG. 26 showing the structure of the essential parts in the fabrication stage of FIGS. 31A to 31C of the second embodiment.

Next, non-doped amorphous silicon 24 is deposited along the outside walls of the TEOS film 20 by a CVD method as shown in FIG. 31A to FIG. 31C. A this time, after the non-doped amorphous silicon layer 24 is deposited along the top and side walls of the TEOS film 20 and the top of the non-doped amorphous silicon layer 10 as a liner layer according to the CVD method, the portions of the amorphous silicon layer 24 deposited on the upper surface of the TEOS film 20 and the amorphous silicon layer 10 are selectively removed by an anisotropic etching process. As a result, the amorphous silicon layer 24 can be formed along the outer wall of the TEOS film 20 but not the top of the TEOS film 20 or amorphous silicon layer 10. FIG. 32 shows the amorphous silicon layer 24 as it is formed in the fringe area of the device in this fabrication process.

Figure 33A:
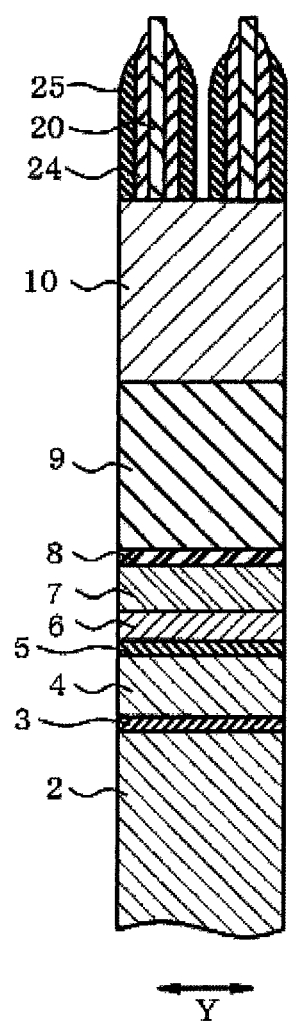
FIGS. 33A to 33C show longitudinal side views showing a stage of the fabricating process following FIGS. 31A to 31C in the second embodiment.
Figure 33B:
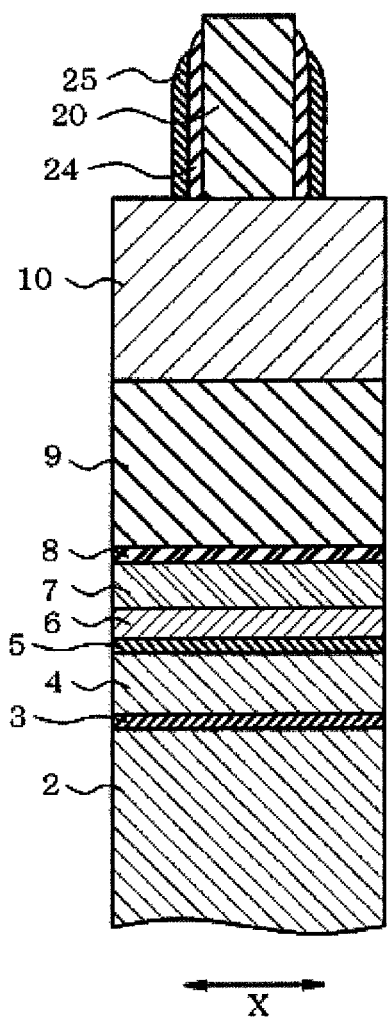
Figure 33C:
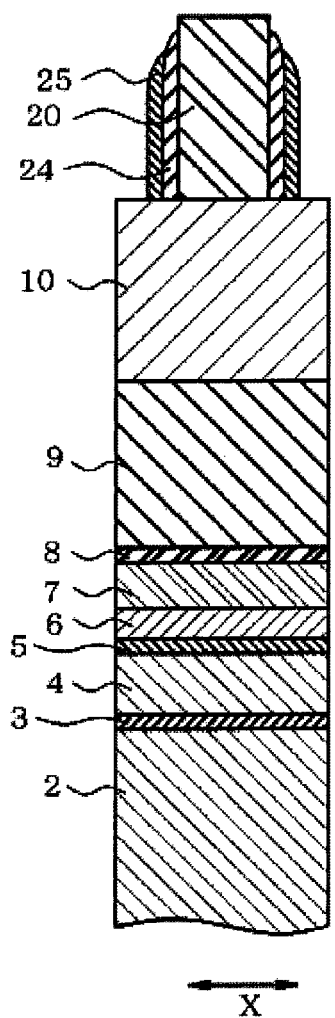

Next, as shown in FIG. 33A to FIG. 33C, the silicon nitride film 25 (outside sideward pattern) is formed along the outside wall of the amorphous silicon layer 24. At this moment, the silicon nitride film 25 is deposited along the upper surface and the side surface of the amorphous silicon layer 24 and on the upper surface of the dTEOS film 20, as well as on the upper surface of the amorphous silicon layer 10 according to the CVD method. The silicon nitride film 25 is then anisotropically etched according to the RIE method to remove it from the top of the features but leave it remaining on the sides of the amorphous silicon layer 24.

Figure 34:
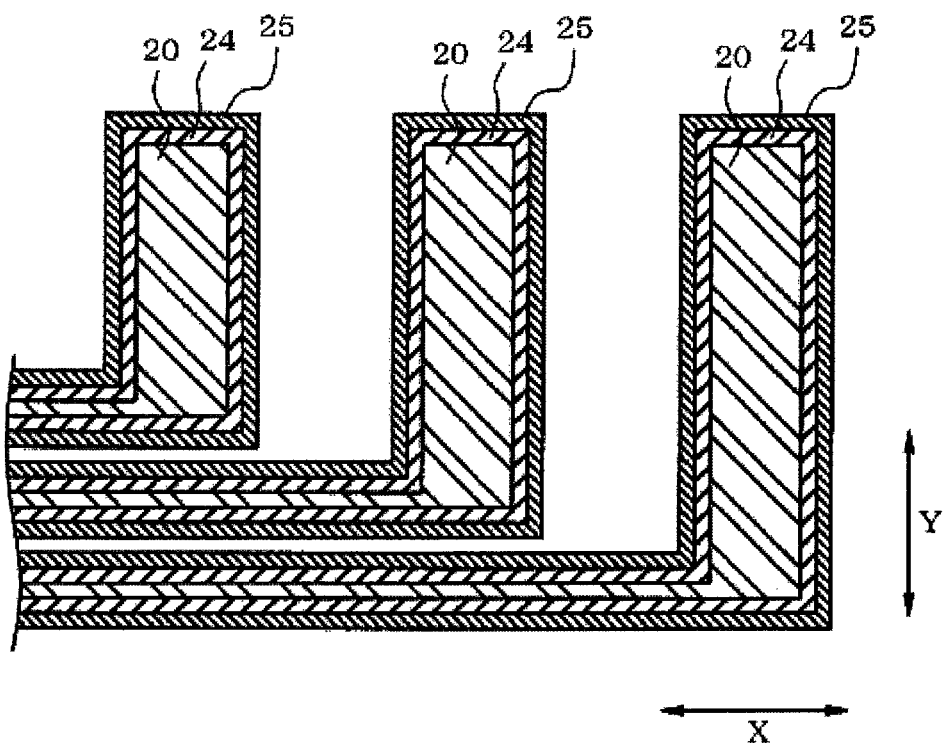
FIG. 34 is a diagram equivalent to FIG. 26 showing the structure of the essential parts in the fabrication stage of FIGS. 33A to 33C of the second embodiment.

As a result, the silicon nitride film 25 can be formed along the outside wall of the amorphous silicon layer 24. The amorphous silicon layers 10 and 24 are crystallized by the heat of the silicon nitride film 25 deposition step, thereby converting the amorphous silicon thereon to polysilicon. In the following, these now polysilicon layers 10 and 24 are shown as the silicon layers 10 and 24, respectively. FIG. 34 shows the formation area of the silicon nitride film 25 on the fringe area of the device in this fabrication step.

Figure 35A:
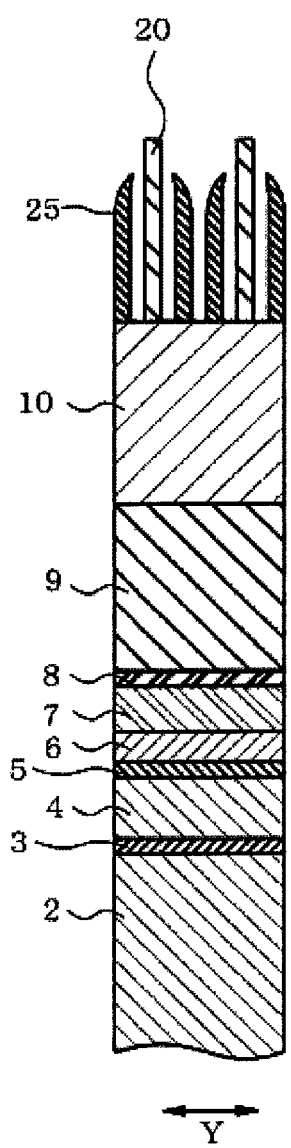
FIGS. 35A to 35C show longitudinal side views showing a stage of the fabricating process following FIGS. 33A to 33C in the second embodiment.
Figure 35B:
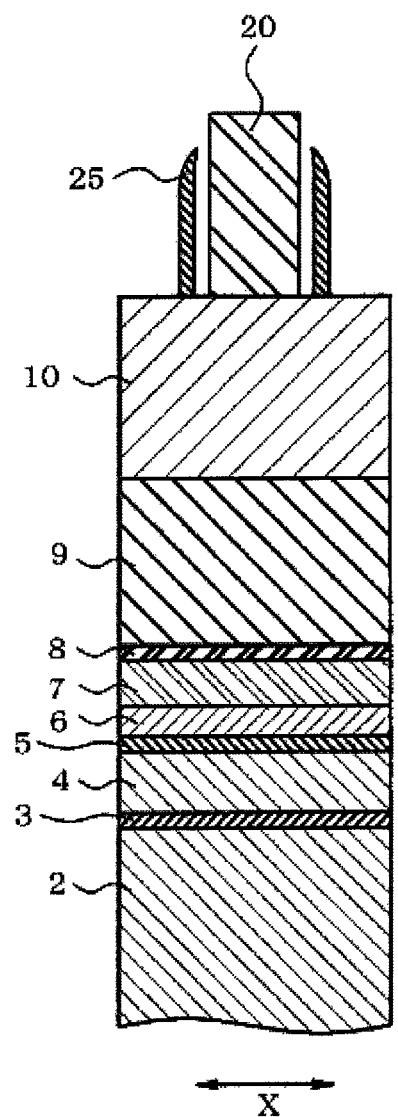
Figure 35C:
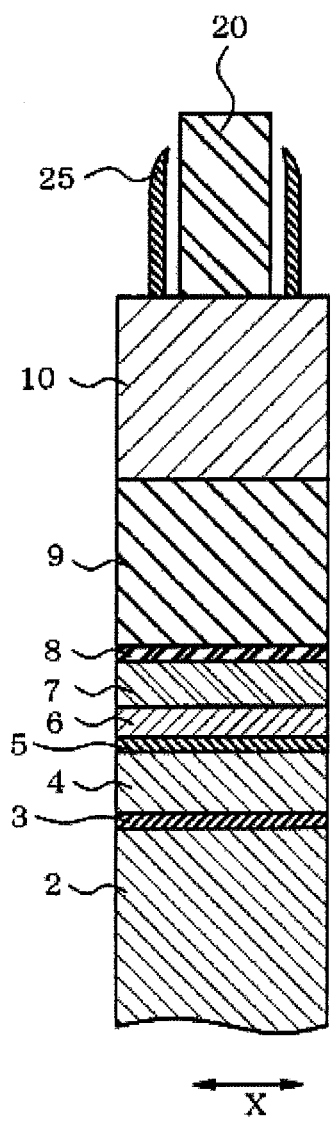
Figure 36:
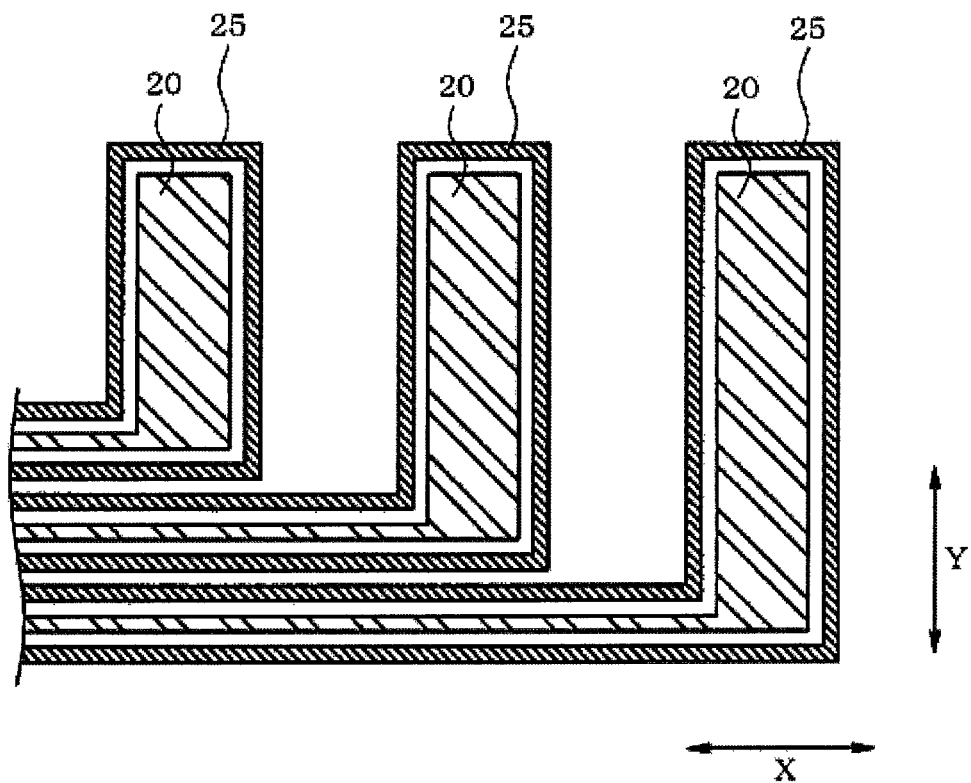
FIG. 36 is a diagram equivalent to FIG. 26 showing the structure of the essential parts in the fabrication stage of FIGS. 35A to 35C of the second embodiment.

Next, as shown in FIG. 35A to FIG. 35C, the silicon layer 24 is selectively removed by the wet etching. It is also acceptable to use the dry etching treatment. Thus, as shown in FIG. 36, the silicon layer 24 between the side walls of the TEOS film 20 and the side walls of the silicon nitride film 25 is removed, and there are no other films lying between opposite side walls of the dTEOS film 20 and the silicon nitride film 25 facing each other. That is, the silicon layer 24 was used as a removable spacer.

Figure 37A:
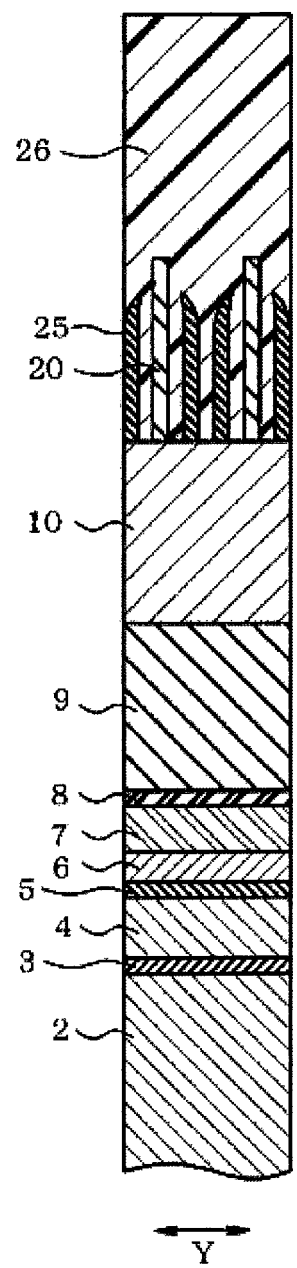
FIGS. 37A to 37C show longitudinal side views showing a stage of the fabricating process following FIGS. 35A to 35C in the second embodiment.
Figure 37B:
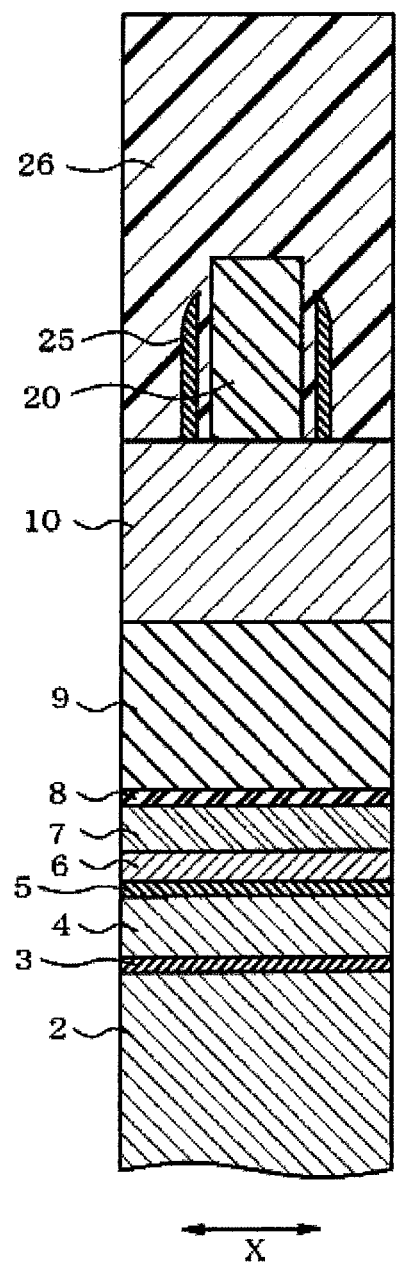
Figure 37C:
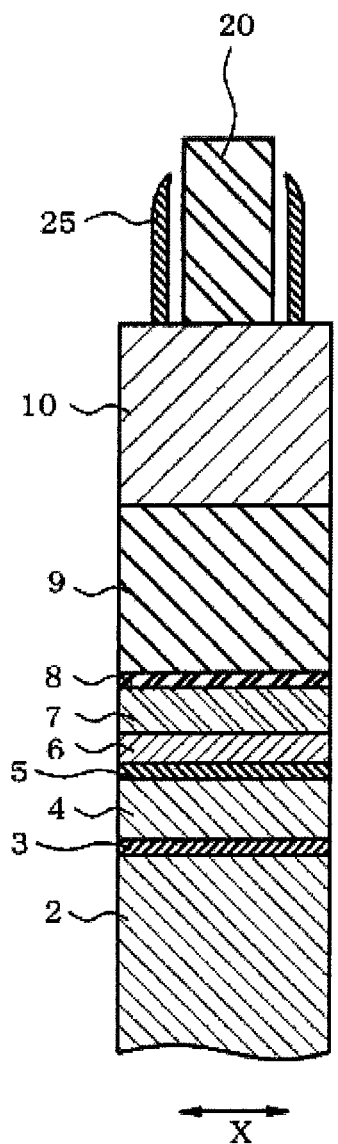
Figure 38:
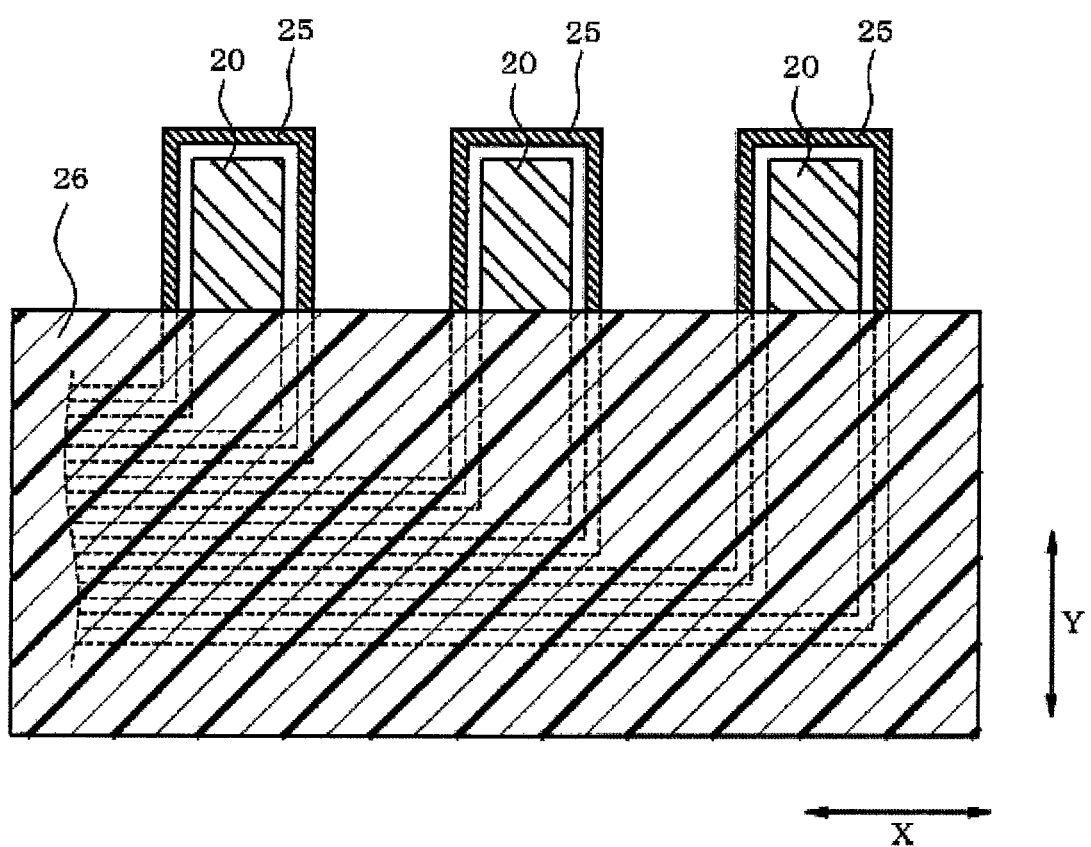
FIG. 38 is a diagram equivalent to FIG. 26 showing the structure of the essential parts in the fabrication stage of FIGS. 37A to 37C of the second embodiment.

Next, the resist is coated and patterned to form the resist pattern 26 as shown in FIG. 37A to FIG. 37C (see the cross section in FIG. 37A and FIG. 37B). The formation area of this resist pattern 26 differs from the previous embodiment, as shown in FIG. 38. The TEOS film 20 and the silicon nitride film 25 on the memory cell MC formation area side of the word lines $WL_{3n}$-$WL_{3n+2}$ are covered, and the region has the most distal point of the dTEOS film 20 and the silicon nitride film 25 exposed. This resist pattern 26 is provided for defining the outer frame of the fringe pattern pad FP2.

Figure 39A:
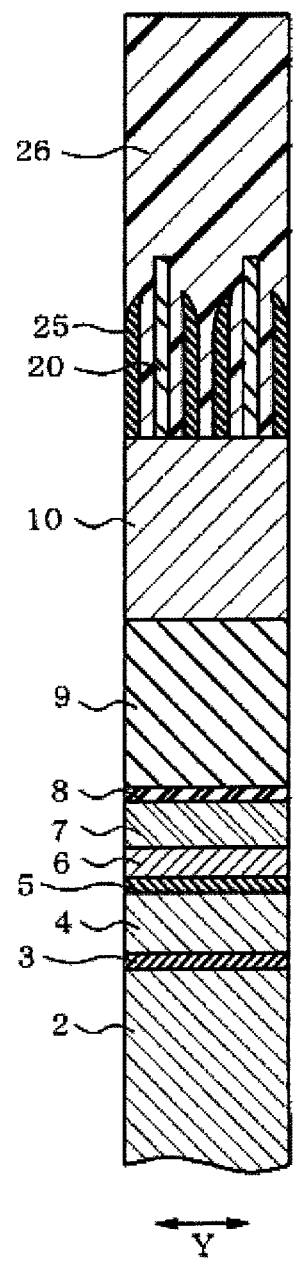
FIGS. 39A to 39C show longitudinal side views showing a stage of the fabricating process following FIGS. 37A to 37C in the second embodiment.
Figure 39B:
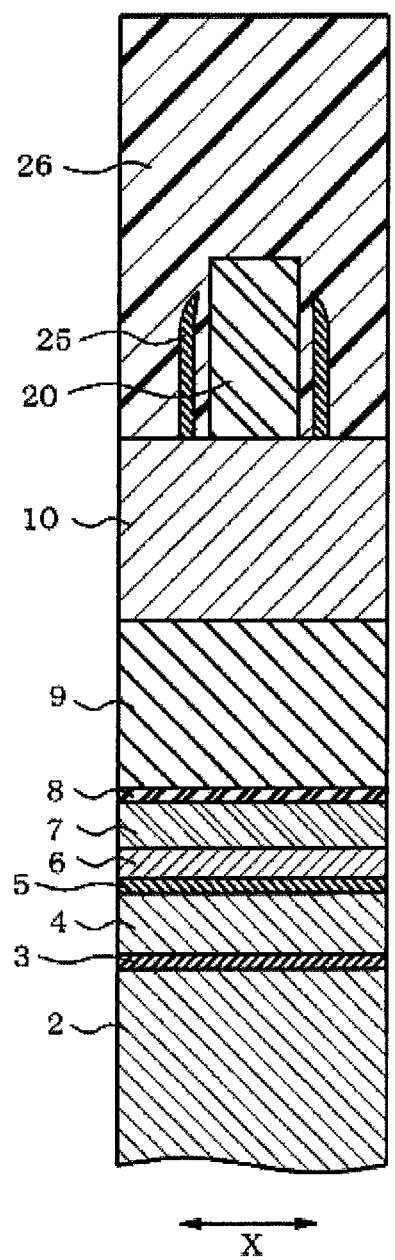
Figure 39C:
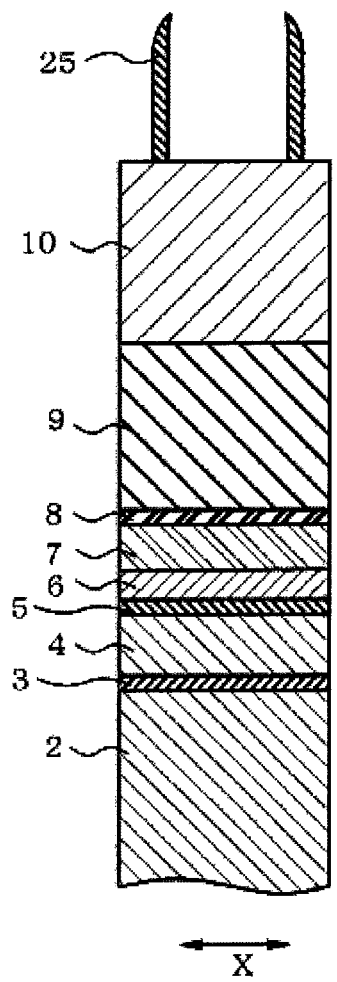
Figure 40:
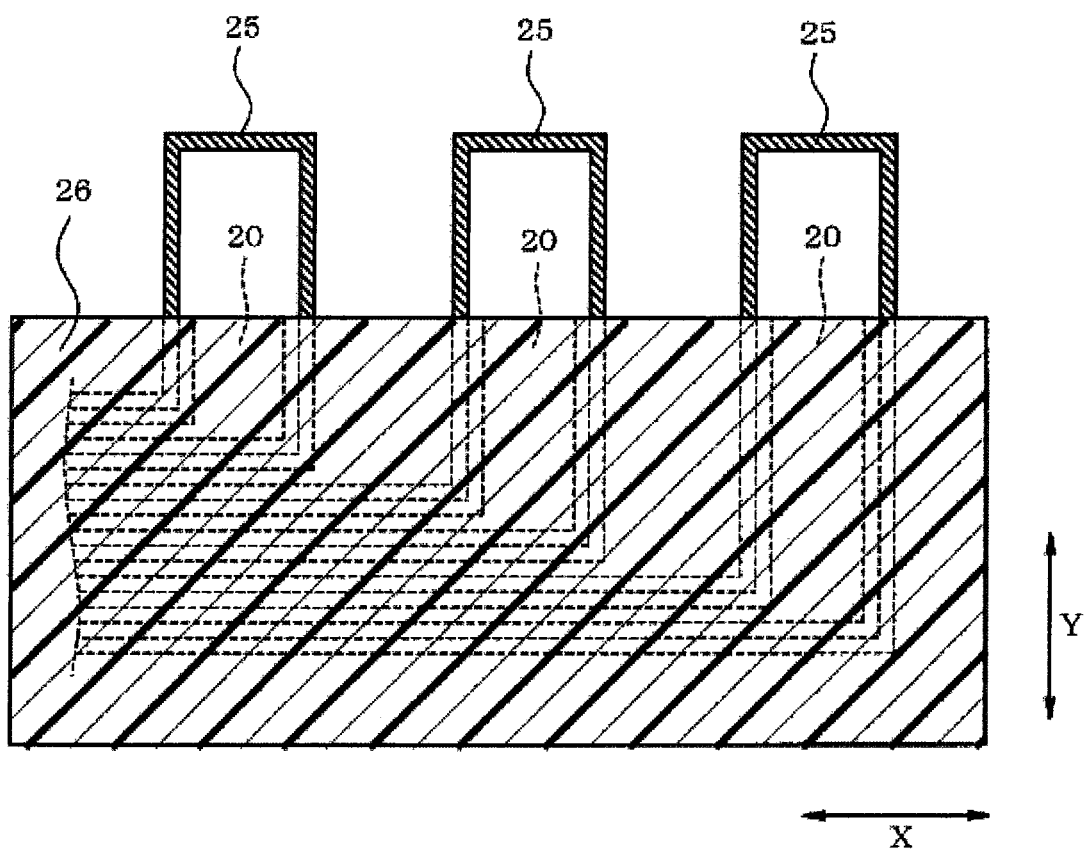
FIG. 40 is a diagram equivalent to FIG. 26 showing the structure of the essential parts in the fabrication stage of FIGS. 39A to 39C of the second embodiment.

Subsequently, as shown in FIG. 39A to FIG. 39C, the TEOS film 20 is etched at a high selectivity to the resist pattern 26 and the silicon nitride film 25, and thus the TEOS film 20 is selectively removed. Thus, the dTEOS film 20 on the silicon layer 10 can be removed to yield spikes or pillars of silicon nitride standing alone atop silicon layer 10 in the cross section shown in FIG. 39C, and a U-shaped thin walled structure of silicon nitride remains where it had been previously deposited as a thin film on the TEOS layer (refer to FIG. 40 to form part of the fringe area mask for forming the features of the connector lines to the outwardly lying fringe pattern pads FP1 and FP3.

Figure 41A:
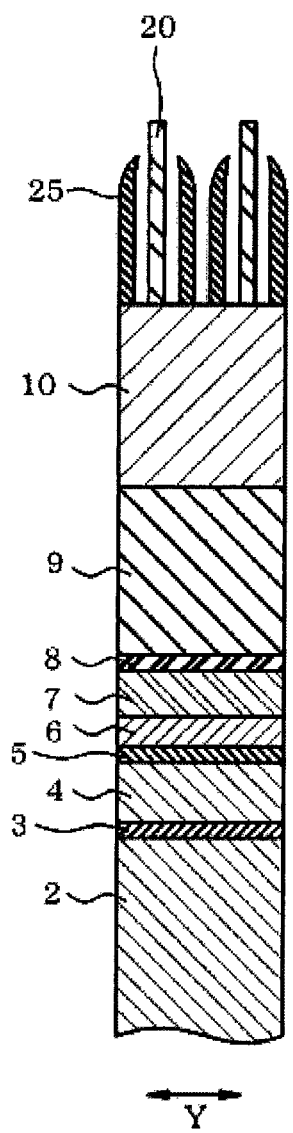
FIGS. 41A to 41C show longitudinal side views showing a stage of the fabricating process following FIGS. 39A to 39C in the second embodiment.
Figure 41B:
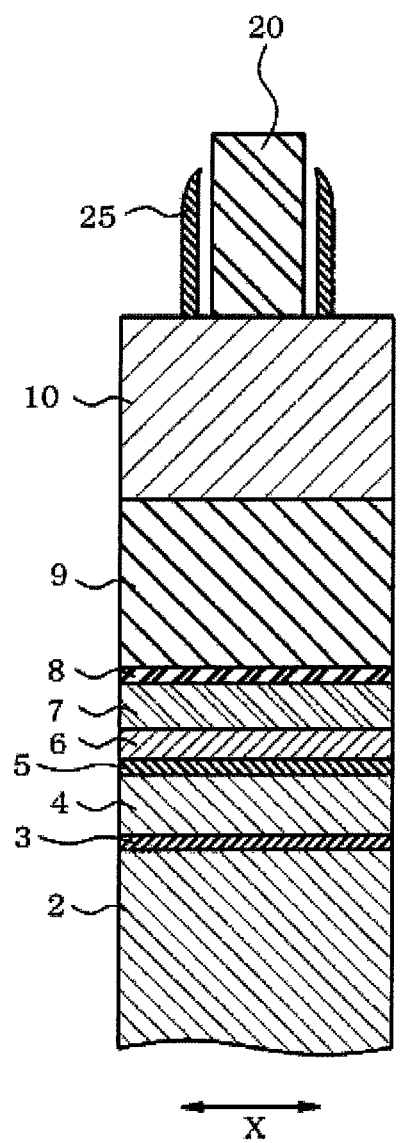
Figure 41C:
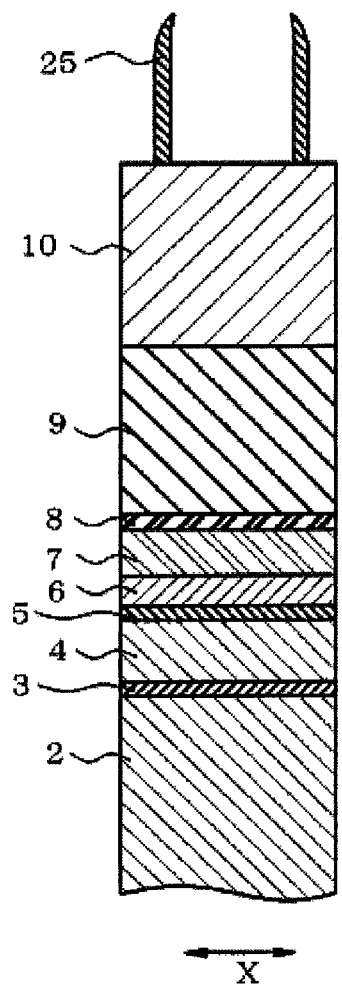
Figure 42:
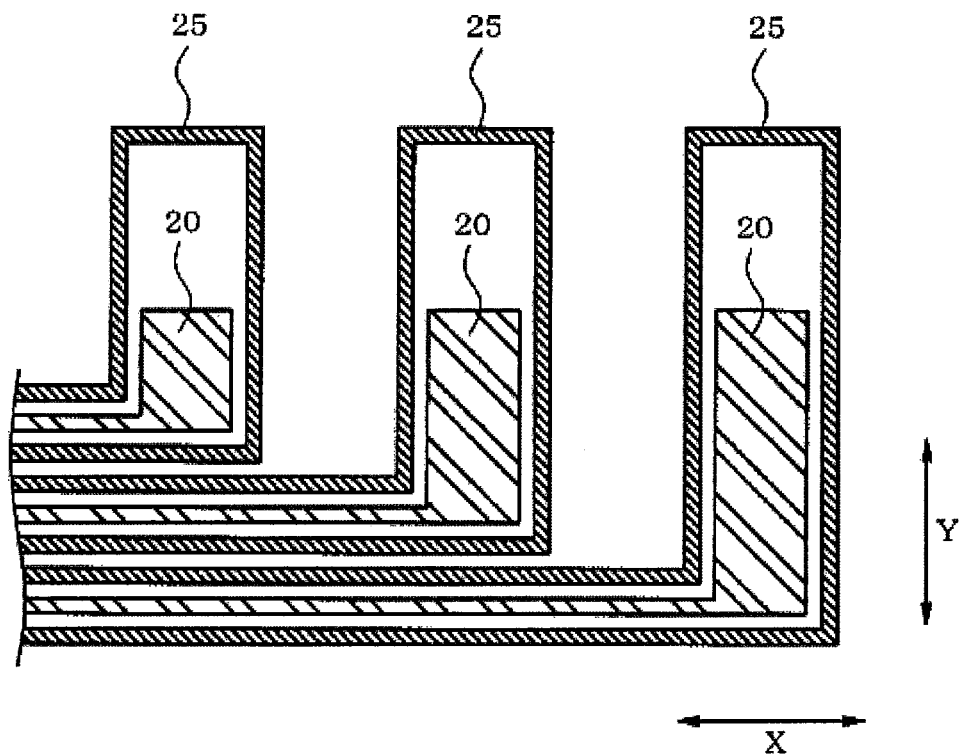
FIG. 42 is a diagram equivalent to FIG. 26 showing the structure of the essential parts in the fabrication stage of FIGS. 41A to 41C of the second embodiment.

Subsequently, the resist pattern 26 is removed, such as by ashing in an oxygen environment and where needed, following with a liquid chemical etchant, to yield the structures shown in FIG. 41A to FIG. 41C. Thus, as shown in FIG. 42, the upper surface and the side surface of the dTEOS film 20 and the silicon nitride film 25 on the formation area side of the memory cell MC are exposed.

Figure 43A:
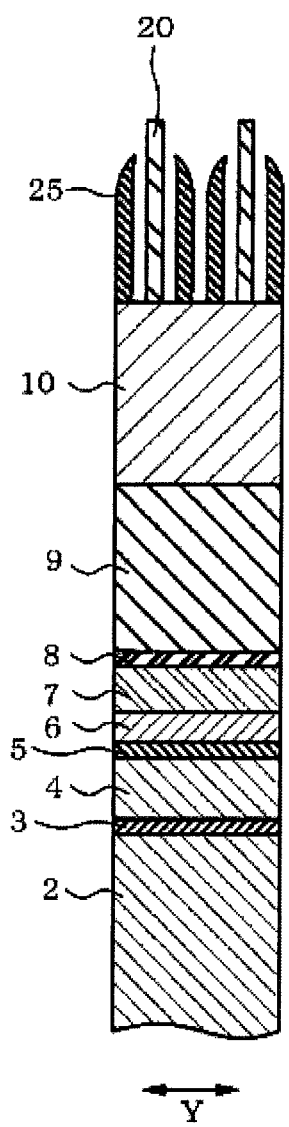
FIGS. 43A to 43C show longitudinal side views showing a stage of the fabricating process following FIGS. 41A to 41C in the second embodiment.
Figure 43B:
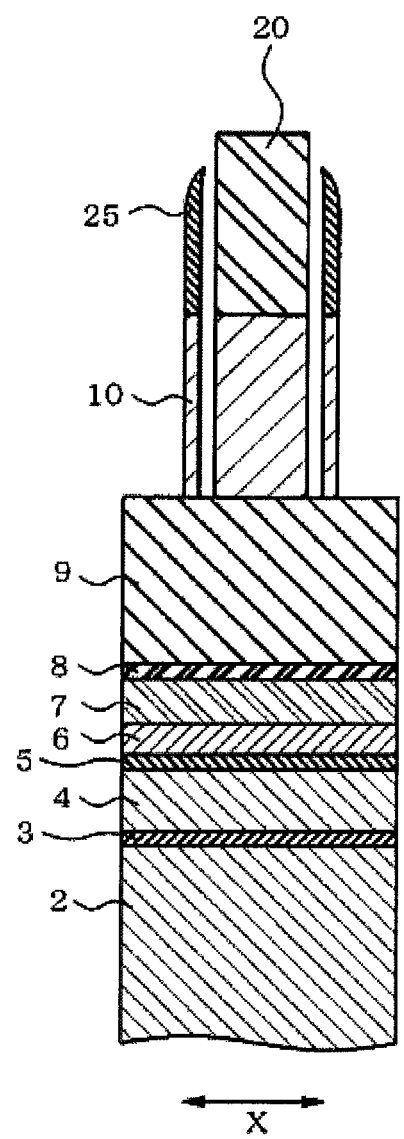
Figure 43C:
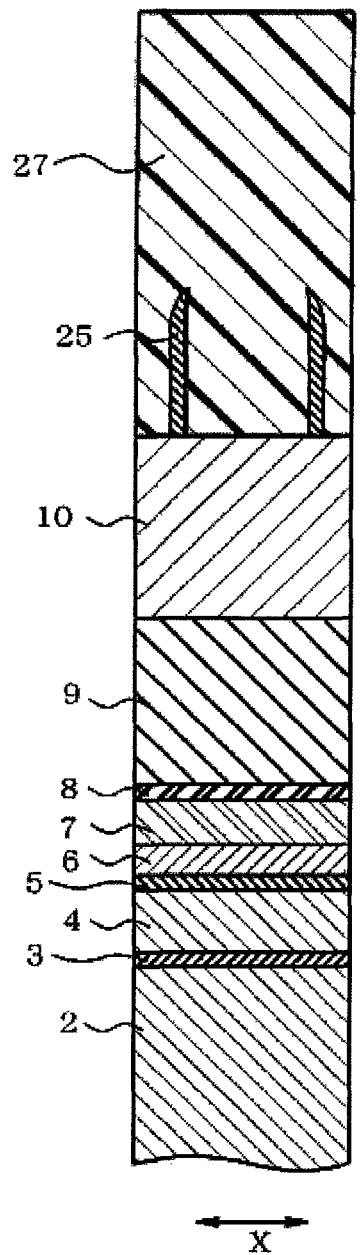
Figure 44:
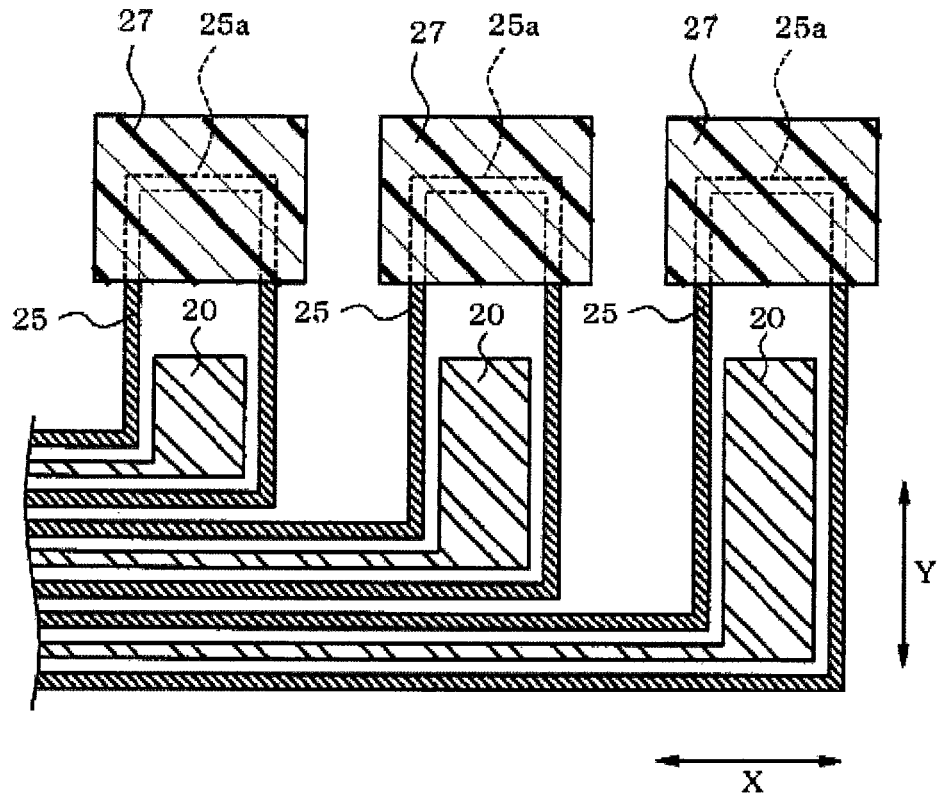
FIG. 44 is a diagram equivalent to FIG. 26 showing the structure of the essential parts in the fabrication stage of FIGS. 43A to 43C of the second embodiment.

Subsequently, as shown in FIG. 43A to FIG. 43C, an additional resist layer 27 covers an area of the TEOS film 20 is covered, to form a resist pattern 27 (the third mask pattern) (see FIG. 43C). The formation area of this resist pattern 27, as shown in FIG. 44, includes the outer area of the fringe area on which the U shaped thin wall of silicon nitride is positioned, the most distal point 25a thereof extending in the linear state of the silicon nitride film 25, and the rectangular area does not contain the residual area of the TEOS film 20.

Figure 45A:
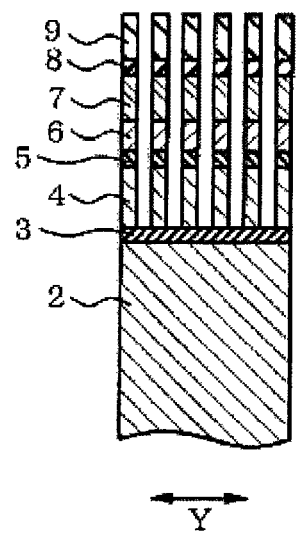
FIGS. 45A to 45C show longitudinal side views showing a stage of the fabricating process following FIGS. 43A to 43C in the second embodiment.
Figure 45B:
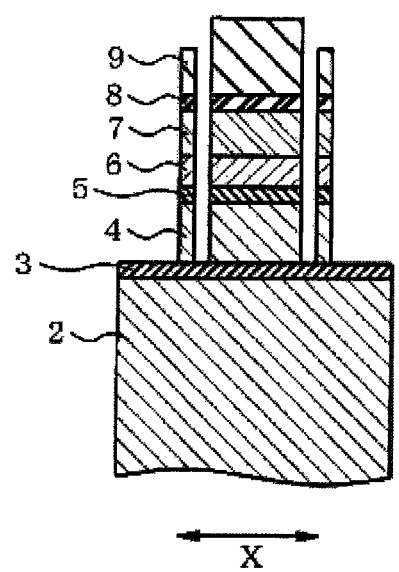
Figure 45C:
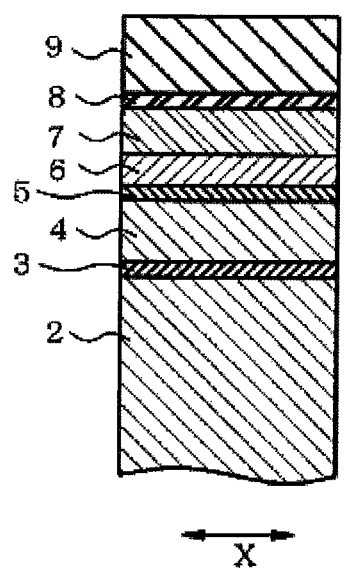
Figure 46:
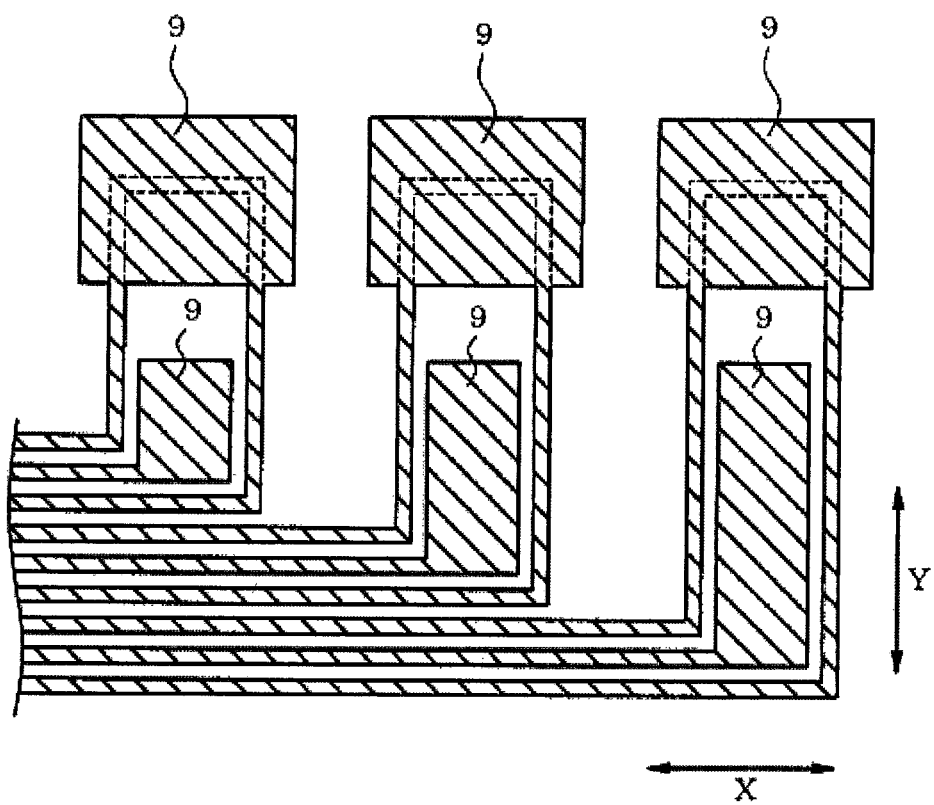
FIG. 46 is a diagram equivalent to FIG. 26 showing the structure of the essential parts in the fabrication stage of FIGS. 45A to 45C of the second embodiment.

Next, as shown in FIG. 45A to FIG. 45C, the layer stacks 4 to 9 are divided into sections by anisotropic etching of the resist pattern 27, the TEOS film 20, and the silicon nitride film 25 as a mask according to the RIE method. FIG. 46 shows the formation area of top layer TEOS film 9 and the residual area of the stacked structural layers 4 to 9 at this moment. Next, as, the pads FP1 and FP# are formed by etching a trench through the uppermost layer stacks, to yield the structure shown in FIG. 26. Then, similar with the previous embodiment, a drawn-out line and pad can be formed by exposing the upper surface of the silicide layer 7 of the fringe pattern pads FP1 to FP3, i.e., by removing layers 8 and 9.

According to this embodiment, a part of the fringe mask pattern of the EOS film 20 most distal from the memory cell MC is removed, and the linear loop-back region of the silicon nitride film 25 is covered with the rectangular resist pattern 27; the stacked structural layers 4 to 9 are anisotropically etched by masking the residual part of the resist pattern 27, the silicon nitride film 25, and the dTEOS film 20; the stacked structural layers 4 to 9 in the loop-back region are processed with loop cutting. Therefore, nearly the same effects as in the embodiment described above can be obtained. Moreover, the connector line P1 of the word lines $WL_{3n}$ and $WL_{3n+2}$ are projected from the vicinity located at the edge of the Y direction of the fringe pattern pads FP1 and FP3. In this case, even if there is a slight shift in the positioning of the exposure mask while patterning the resist pattern 27 as shown in FIG. 44, the structure with the connector line P1 protruding from the periphery of the fringe pattern pads FP1 and FP3 could be easily formed. Therefore, the range of tolerance for positioning of the exposure mask when patterning the resist pattern 27 can be widened.

OTHER EMBODIMENTS

This method is applied to the NAND type flash memory device 1, and it is also applicable to the semiconductor devices that include various connector line and the non-volatile semiconductor memory devices such as the AND type and other EEPROM. The embodiments show patterning of the resist pattern 18 and 27 into a planar rectangular shape, but it is not limited to this shape. For example, the resist patterns 18 and 27 may be patterned to other polygons (pentagon, hexagon, etc.), and the stacked structural layers 4 to 9 may be etching processed.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
   memory cells that are arranged in a matrix; and
   a plurality of groups, wherein each group includes word lines consisting of a first word line, a second word line, and a third word line, and pads consisting of a first pad, a second pad, and a third pad, wherein for each group:
   the second word line is located between the first word line and the third word line;
   the third word line is adjacent to the first line of an adjacent group;
   the first pad is located at an end of, and in electrical continuity with, the first word line and having a width that is wider than a width of the first word line;
   the second pad is located at an end of, and in electrical continuity with, the second word line and having a width that is wider than a width of the second word line;
   the third pad is located at an end of, and in electrical continuity with, the third word line and having a width that is wider than a width of the third word line; and
   the second pad is arranged closer to the matrix of memory cells than the first and third pads.

2. The semiconductor device of claim 1, wherein the first, second, and third pads each have a planar rectangular shape.

3. The semiconductor device of claim 2, wherein the first and third pads each have a long side that is shorter than a long side of the second pad.

4. The semiconductor device of claim 1, wherein each word line includes a connecting portion extending to an individual pad.

5. The semiconductor device of claim 4, wherein the connecting portion of the second word line is disposed between the connecting portions of the first and third word lines.

6. The semiconductor device of claim 5, wherein the connecting portion of at least one of the third and first word lines includes a first part which extends generally parallel to a side of the second pad.

7. The semiconductor device of claim 6, wherein the connecting portion which includes the first part which extends generally parallel to the side of the second pad also includes a bent offset portion which extends from the first part to a position adjacent to the pad to which it is connected.

8. The semiconductor device of claim 6, wherein the connecting portion which includes the first part which extends generally parallel to the side of the second pad also extends in a generally straight line to a position adjacent to the pad to which it is connected.

9. The semiconductor device according to claim 1, wherein the second pad has a generally rectangular shape, and the second word line extends from an interior region of the semiconductor device to a corner region of the second pad.

10. The semiconductor device of claim 1, wherein the first word line extends from an interior region of the semiconductor device to a position intermediate two ends of a side of the first pad.

11. The semiconductor device of claim 1, wherein
   the first pad extends in a direction perpendicular to the first word line,
   the second pad extends in a direction perpendicular to the second word line,
   the third pad extends in a direction perpendicular to the third word line, and
   a center of the second pad in a short direction thereof is located between a center of the first pad in a short direction thereof and a center of the third pad in a short direction thereof.

12. The semiconductor device of claim 1, wherein
   the first pads of the plurality of the groups have a same plane shape,
   the second pads of the plurality of the groups have a same plane shape, and
   the third pads of the plurality of the groups have a same plane shape.

13. The semiconductor device of claim 1, wherein
   the first word line includes a first portion that extends parallel to a longitudinal direction of the second pad, a second portion that is connected to the first portion and extends away from the second pad, and a third portion that is connected to the second portion and extends parallel to a longitudinal direction of the first pad, and a fourth portion connects the third portion and the first pad.

14. The semiconductor device of claim 13, wherein
   the third word line includes a fifth portion that extends to the longitudinal direction of the second pad, a sixth portion that is connected to the fifth portion and extends away from the second pad, a seventh portion that is connected to the sixth portion and extends parallel to a longitudinal direction of the third pad, and an eighth portion that connects the seventh portion and the third pad.

15. The semiconductor device of claim 14, wherein
   the first pad and the third pad are arranged proximate to each other, and
   a region surrounded by the second, third, sixth, and seventh portions, and the first and third pads, substantially has a rectangular shape.

16. The semiconductor device of claim 15, wherein
   the second portion and the sixth portion are symmetrical with respect to a center of the second pad extending in a longitudinal direction thereof,
   the third portion and the seventh portion are symmetrical with respect to the center, and
   the fourth portion and the eighth portion are symmetrical with respect to the center.

17. The semiconductor device of claim 1, wherein
   the first word line includes a first portion that extends parallel to a longitudinal direction of the second pad and towards the first pad,
   the third word line includes a second portion that extends parallel to the longitudinal direction of the second pad and towards the third pad,
   the first pad and the third pad are arranged proximate to each other, and
   a region surrounded by the first and second portions, and the first, second, and third pads substantially has a rectangular shape.

* * * * *